(12) United States Patent
Hush

(10) Patent No.: US 10,074,416 B2
(45) Date of Patent: Sep. 11, 2018

(54) APPARATUSES AND METHODS FOR DATA MOVEMENT

(71) Applicant: Micron Technology, Inc., Boise, ID (US)

(72) Inventor: Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 152 days.

(21) Appl. No.: 15/082,652

(22) Filed: Mar. 28, 2016

(65) Prior Publication Data

US 2017/0278559 A1   Sep. 28, 2017

(51) Int. Cl.

| G11C 7/10 | (2006.01) |
|---|---|
| G11C 11/4091 | (2006.01) |
| G11C 11/4093 | (2006.01) |
| G11C 11/4096 | (2006.01) |

(52) U.S. Cl.
CPC ...... *G11C 11/4091* (2013.01); *G11C 11/4093* (2013.01); *G11C 11/4096* (2013.01)

(58) Field of Classification Search
CPC ............ G11C 11/4091; G11C 11/4096; G11C 11/4093
See application file for complete search history.

(56) References Cited

U.S. PATENT DOCUMENTS

| 4,380,046 A | 4/1983 | Fung |
|---|---|---|
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |

(Continued)

FOREIGN PATENT DOCUMENTS

| CN | 102141905 | 8/2011 |
|---|---|---|
| EP | 0214718 | 3/1987 |

(Continued)

OTHER PUBLICATIONS

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

(Continued)

*Primary Examiner* — Mohammed A Bashar
(74) *Attorney, Agent, or Firm* — Brooks, Cameron & Huebsch, PLLC

(57) ABSTRACT

The present disclosure includes apparatuses and methods for data movement. An example apparatus includes a memory device that includes a plurality of subarrays of memory cells and sensing circuitry coupled to the plurality of subarrays. The sensing circuitry includes a sense amplifier and a compute component. The memory device includes a latch selectably coupled to a column of the memory cells and configured to store a data value moved from the sensing circuitry. The memory device includes a controller configured to direct movement of the data value from the sensing circuitry to the latch.

32 Claims, 9 Drawing Sheets

(56) References Cited

U.S. PATENT DOCUMENTS

| | | |
|---|---|---|
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,130,852 A | 10/2000 | Ohtani et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,063 B1 | 7/2002 | Seitsinger et al. |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Gamey |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,936,634 B2 | 5/2011 | Chen et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,406,033 B2 | 3/2013 | Lung et al. |
| 8,417,921 B2 | 4/2013 | Gonion et al. |
| 8,462,532 B1 | 6/2013 | Argyres |
| 8,473,809 B2 | 6/2013 | Wan et al. |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,298,545 B2 | 3/2016 | Ratnam et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0132457 A1 | 7/2003 | Lee et al. |
| 2003/0167426 A1 | 9/2003 | Slobodnik |

(56) References Cited

U.S. PATENT DOCUMENTS

| | | |
|---|---|---|
| 2003/0222879 A1 | 12/2003 | Lin et al. |
| 2004/0017691 A1 | 1/2004 | Luk et al. |
| 2004/0073592 A1 | 4/2004 | Kim et al. |
| 2004/0073773 A1 | 4/2004 | Demjanenko |
| 2004/0085835 A1* | 5/2004 | Ahn ................. G11C 7/18 365/200 |
| 2004/0085840 A1 | 5/2004 | Vali et al. |
| 2004/0095826 A1 | 5/2004 | Penner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0231944 A1 | 9/2009 | Faue |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0002169 A1* | 1/2011 | Li ................. G11C 29/808 365/185.09 |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0247549 A1* | 8/2016 | Takagiwa ............... G11C 7/106 |
| 2016/0307609 A1* | 10/2016 | Harris ................ G11O 5/025 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | 201101329 | 1/2011 |
| TW | 201303595 | 1/2013 |
| TW | I454910 | 10/2014 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

(56) References Cited

OTHER PUBLICATIONS

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.
U.S. Appl. No. 13/743,686, entitled, "Weighted Search and Compare in a Memory Evice," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 2, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for related PCT Application No. PCT/US2017/023162, dated Jul. 3, 2017, 14 pages.
U.S. Appl. No. 13/743,686, entitled, "Weighted Search and Compare in a Memory Device," filed Jan. 17, 2013, (25 pgs.).
U.S. Appl. No. 13/774,553, entitled, "Neural Network in a Memory Device," filed Feb. 22, 2013, (63 pgs.).
Office Action for related Taiwan Patent Application No. 106110358, dated Oct. 6, 2017, 19 pages.

\* cited by examiner

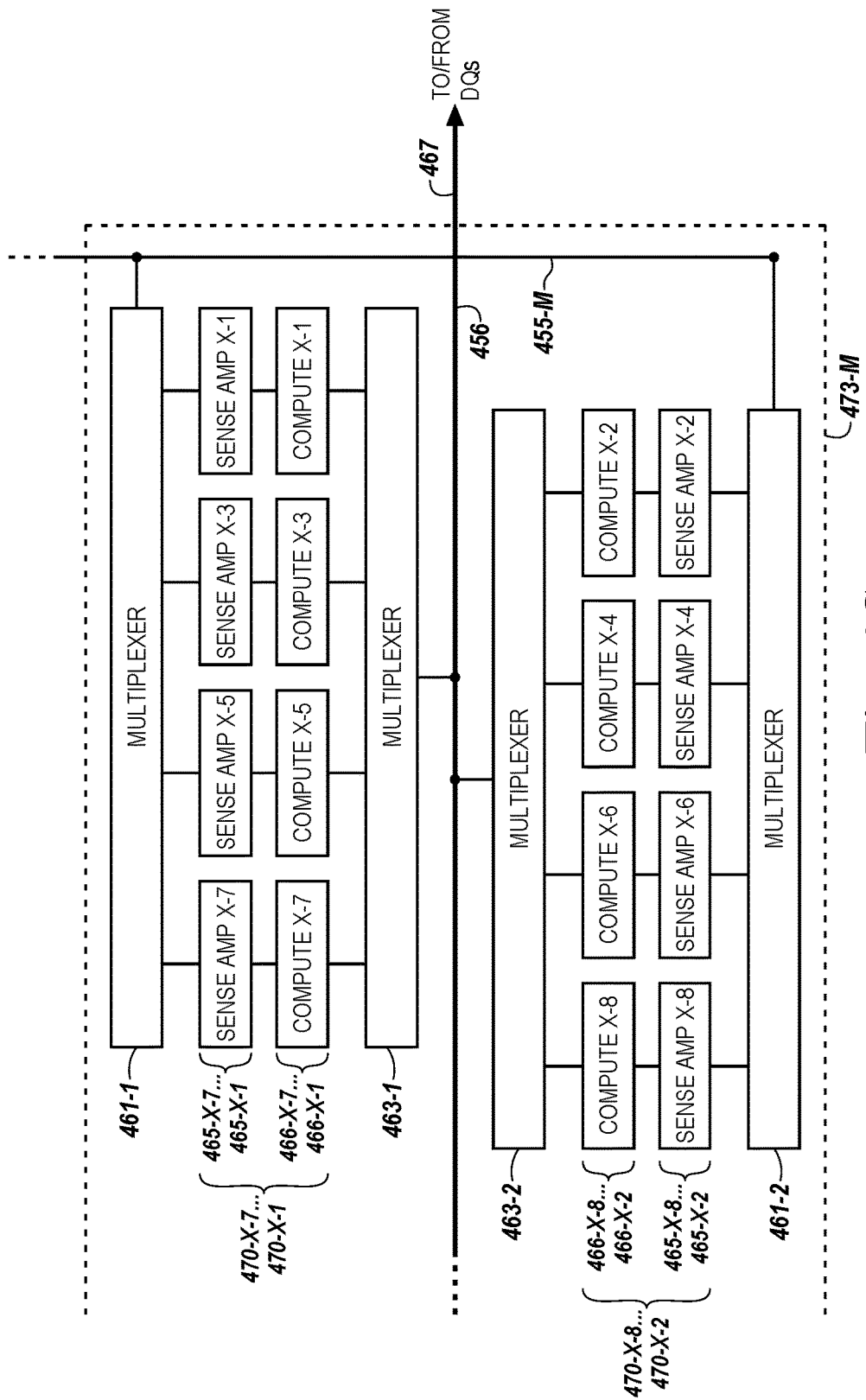

APPARATUSES AND METHODS FOR DATA MOVEMENT

TECHNICAL FIELD

The present disclosure relates generally to semiconductor memory and methods, and more particularly, to apparatuses and methods for data movement.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be performed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and associated functional unit circuitry) may be external to the memory array, and data is accessed via a bus between the processing resources and the memory array to execute a set of instructions. Processing performance may be improved in a processor-in-memory device, in which a processor may be implemented internally and/or near to a memory (e.g., directly on a same chip as the memory array). A processing-in-memory device may save time by reducing and eliminating external communications and may also conserve power.

BRIEF DESCRIPTION OF THE DRAWINGS

FIGS. 4A-4C are other schematic diagrams illustrating circuitry for data movement in a memory device in accordance with a number of embodiments of the present disclosure.

DETAILED DESCRIPTION

Figure 1A:
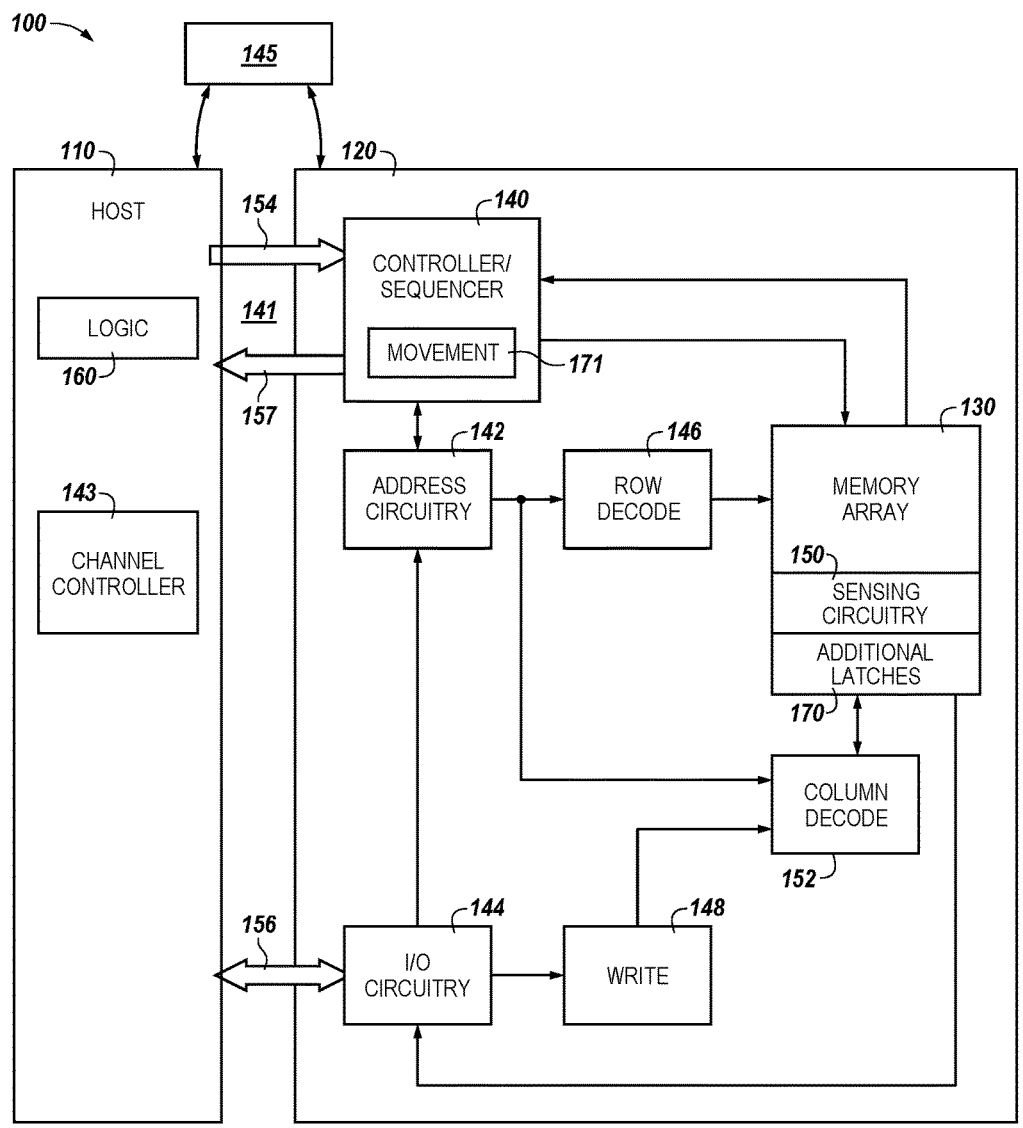
FIG. 1A is a block diagram of an apparatus in the form of a computing system including a memory device in accordance with a number of embodiments of the present disclosure.

The present disclosure includes apparatuses and methods for data movement (e.g., for processing-in-memory (PIM) structures). In at least one embodiment, the apparatus includes a memory device that includes a plurality of subarrays of memory cells and sensing circuitry coupled to the plurality of subarrays. The sensing circuitry includes a sense amplifier and a compute component (e.g., coupled to each column of memory cells). The memory device includes a latch selectably coupled to a column of the memory cells and configured to store (e.g., cache) a data value moved from the sensing circuitry. The memory device includes a controller configured to direct movement of the data value from the sensing circuitry to the latch.

As described in more detail below, the embodiments can allow a host system to allocate a number of locations (e.g., sub-arrays (or "subarrays")) and portions of subarrays, in one or more DRAM banks to hold (e.g., store) and/or process data. A host system and a controller may perform the address resolution on an entire block of program instructions (e.g., PIM command instructions) and data and direct (e.g., control) allocation, storage, and/or movement (e.g., flow) of data and commands into allocated locations (e.g., subarrays and portions of subarrays) within a destination (e.g., target) bank. Writing data and/or executing commands (e.g., performing operations, as described herein) may utilize a normal DRAM write path to the DRAM device. As the reader will appreciate, while a DRAM-style PIM device is discussed with regard to examples presented herein, embodiments are not limited to a PIM DRAM implementation.

The memory devices described herein can use a number of controllers for a bank of subarrays, controllers for individual subarrays, and/or controllers for latch components (e.g., each controller being a sequencer, a state machine, a microcontroller, a sub-processor, ALU circuitry, or some other type of controller) to execute a set of instructions to perform an operation on data (e.g., one or more operands). As used herein, an operation can be, for example, a Boolean logical operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of logical operations.

The present disclosure describes enablement of operations (e.g., PIM operations, such as AND, OR, refresh, row copy, shift, add, multiply, etc.) to be performed on data values stored in memory cells (e.g., when moved to latches, as described herein) substantially simultaneously with performance of, for example, read and/or write operations on data values from a same bank, a same subarray in the same bank, and/or a same row in the same subarray (e.g., in a DRAM array, among other types of memory arrays). For example, the operations can be performed on data values stored in a row of memory cells of a subarray substantially simultaneously with performance of read and/or write operations on the same data values by a controller and/or a host, as described herein.

Accordingly, when a row is activated to be sensed in a DRAM PIM array, data values stored in memory cells of the row (e.g., data values for the entire row) may be moved (e.g., copied, transferred, and/or transported) to a number of sense amplifiers (e.g., that each form at least a portion of the latches) that are adjacent to the DRAM array. In some embodiments described herein, a latch component that includes a number of latches (e.g., which may be the same number as the number of memory cells in a row of a bank) may be formed on a periphery of a bank of memory cells, whereas sensing circuitry for each subarray may be included (e.g., formed) in a plurality of sensing component stripes that are physically associated with each of a plurality of subarrays in the bank. The latches may be configured to couple (e.g., directly or indirectly connect, as described herein) to a data path (e.g., a data bus connected to the host) that connects a bank of the DRAM array to a combined data bus (e.g., shared by all subarrays, banks, and/or memory devices of the DRAM array).

Hence, the present disclosure describes, in some embodiments, that when a row is sensed, the data values in the row (e.g., the data values from all 16,384 memory cells in the row) may be moved to be stored (e.g., cached) in the latch component. As such, the memory cells in the bank, the subarray, and/or the row from which the data values were moved can be available to perform operations on data values stored therein (e.g., by not having these data values stored in a sensing component stripe in the bank).

As used herein, data movement is an inclusive term that includes, for instance, copying, transferring, and/or transporting data values from a source location to a destination location. Data can, for example, be moved from a sensing component stripe of a subarray to be stored in a latch component via an I/O line shared by the sensing component stripe and the latch component, as described herein. Copying the data values can indicate that the data values stored (cached) in the sensing component stripe are copied and moved to the latch component and that the original data values stored in the row of the subarray may remain unchanged. Transferring the data values can indicate that the data values stored (cached) in the sensing component stripe are copied and moved to the latch component and that at least one of the original data values stored in the row of the subarray may be changed (e.g., by being erased and/or by a subsequent write operation, as described herein). Transporting the data values can be used to indicate the process by which the copied and/or transferred data values are moved (e.g., by the data values being placed on the shared I/O line from the source location and transported to the destination location).

Implementations of PIM DRAM architecture may perform processing at the sense amplifier and compute component level (e.g., in a sensing component stripe). Implementations of PIM DRAM architecture may allow only a finite number of memory cells to be connected to each sense amplifier (e.g., around 1K or 1024 memory cells). A sensing component stripe may include from around 8K to around 16K sense amplifiers. For example, a sensing component stripe may be configured to couple to an array of 1K rows and around 16K columns. A sensing component stripe can be used as a building block to construct the larger memory. In an array of a memory device, there may, for example, be 64 sensing component stripes, which corresponds to 64 subarrays, as described herein. A bank of memory (e.g., of memory cells in a DRAM array) may, in some embodiments, include 64K rows by 16K columns of DRAM to provide around 1 gigabit of memory. This bank architecture may be divided into 64 subarrays that each have a configuration of 1K rows by 16K columns. Each subarray may, for example, be configured to be coupled to an adjacent 16K sensing component stripe to yield a total of 64 sensing component stripes.

The present disclosure describes a latch component that includes a number of latches that function as sense amplifiers to store (cache) data values moved (e.g., copied, transferred, and/or transported) from sensing circuitry (e.g., a selected sensing component stripe, which may include 16K sense amplifiers and/or compute components). The latch component can include a number of latch stripes (e.g., where more than one latch stripe each includes a subset of a total number of latches). The latch component 170 and/or latch stripes 172 (e.g., as shown and described in connection with FIGS. 1C and 1D) may be located peripheral to the subarrays in a bank (e.g., although on pitch with the shared I/O lines corresponding to the subarrays). The latch component 170 and/or latch stripes 172 may be aligned with I/O lines shared by sensing circuitry 150 in the sensing component stripe for each subarray and the latches 465, 470 in each latch stripe described herein (e.g., aligned with the shared I/O lines shown at 455-1, 455-2, . . . , 455-M and described in connection with FIGS. 4A-4C).

As such, the architecture can facilitate movement (e.g., copying, transferring, and/or transporting) of data values stored in a row of a subarray to the latches 465, 470 of the latch component via a coupled sensing component stripe and a number of coupled shared I/O lines. Whereas the sensing circuitry (e.g., sense amplifiers and/or compute components of a sensing component stripe) can be directly coupled to the memory cells of a column of memory cells in a subarray, the latch component (e.g., latch stripes and/or latches therein) may not be directly coupled to the memory cells of the subarrays. For example, the latch component described herein can be indirectly coupled to the memory cells of a column via a selectably coupled sensing component stripe and a number of selectably coupled shared I/O lines. The latch component can, in various embodiments, include a number of latch stripes and the latches therein (e.g., each latch including a compute component and/or a sense amplifier, as described herein), along with multiplexers that can selectably couple the latches to respective shared I/O lines and/or data buses. The latch component can function as a cache in which data values from any subarray in the bank can be written to and/or read from by any subarray and/or controller in the bank and/or by the host.

The latch component for each bank can be selectably coupled to a data bus for the bank (e.g., a 64 bit wide data bus). The data buses for each of the banks (e.g., 8 banks in a memory device) can be included in a combined data bus (e.g., a 512 bit common data bus shared by all 8 banks). In some embodiments, a 512 bit data bus that connects the banks to the DQs would be shared between all 8 banks such that each bank moves (e.g., transmits or receives) 512 bits at a time, such that only one bank at a time would transmit or receive data, rather than all 8 banks simultaneously. The combined data bus (e.g., as shown at reference number 456 and described in connection with FIGS. 4A-4C) can enable data to be output to and/or input from the host, where read and/or write operations can be performed on the data values (e.g., via DRAM DQs in the host). As such, when a row is activated (e.g., turned on and sensed), the data values stored therein can be moved to the latch component, which along with the combined data bus can be considered part of the data path in and/or out of the banks.

The data values stored in the latch component can be output to the host (e.g., for read and/or write operations performed via the DRAM DQs in the host) and/or data values upon which operations have been performed by the host (e.g., write operations performed via the DRAM DQs in the host) can be input to and stored by the latch component. During performance of these data movements and/or operations the data values may be isolated from the sensing circuitry of the 64 sensing component stripes. The 64 sensing component stripes are then available to simultaneously perform any other operation (e.g., PIM operations, such as AND, OR, refresh, row copy, shift, add, multiply, etc.) on data stored in their respective subarrays. For example, the data values stored in the sensing component stripes may be released (e.g., erased, written over) after the data values have been moved (e.g., copied, transferred, and/or transported) to the latch component. A sensing component stripe is then available to perform operations on the same data values that were previously moved to the latch component and/or on data values stored in other rows of the respective subarray.

The memory array architecture described herein may provide a number of benefits in addition to those just described. Overall processing speed may be increased by, for example, enabling PIM operations to be performed on data stored in memory cells in parallel with performance of other operations (e.g., performance of DDR4 I/O operations). The latch component may provide temporary row storage for certain functions (e.g., a row swap in which data values of a row are saved elsewhere while the original data values of the row are written over). The latch component may provide storage of data values that is more directly accessible to a controller of a bank. For example, when connected to the controller, the latch component may be used as a cache from which data values of a row can be copied to multiple rows in the bank (e.g., to fill all of the memory cells of the bank with a data value of 0 or 1, copy a row data mask into multiple subarrays of the bank, among other implementations of the cache). In addition, the latch component may participate in movement of the data values from a position closer to the DQs of the host such that a latency period otherwise taken for cycling of data values between the memory cells and the host (e.g., into and/or out of the host DQs) may be shortened.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

As described herein, an I/O line can be selectably shared by a plurality of subarrays, rows, and/or particular columns of memory cells via the sensing component stripe coupled to each of the subarrays. For example, the sense amplifier and/or compute component of each of a selectable subset of a number of columns (e.g., eight column subsets of a total number of columns) can be selectably coupled to each of a plurality of shared I/O lines for data values stored (cached) in the sensing component stripe to be moved (e.g., copied, transferred, and/or transported) to each of the plurality of shared I/O lines. The I/O line can be further shared by the latch components, the latch stripes, and/or a selectable subset of the latches therein. In some embodiments, the number of latches selectably coupled to each shared I/O can correspond to the number of sense amplifiers and/or compute components of the columns selectably coupled to the shared I/O line (e.g., to provide a latch to store each data value moved from the sensing component stripe via the shared I/O line). Because the singular forms "a", "an", and "the" can include both singular and plural referents herein, "a shared I/O line" can be used to refer to "a plurality of shared I/O lines", unless the context clearly dictates otherwise. Moreover, "shared I/O lines" is an abbreviation of "plurality of shared I/O lines".

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, bank arbiter 145, high speed interface (HSI) 141, memory array 130, sensing circuitry 150, and/or a number of additional latches 170 might also be separately considered an "apparatus."

Figure 1B:
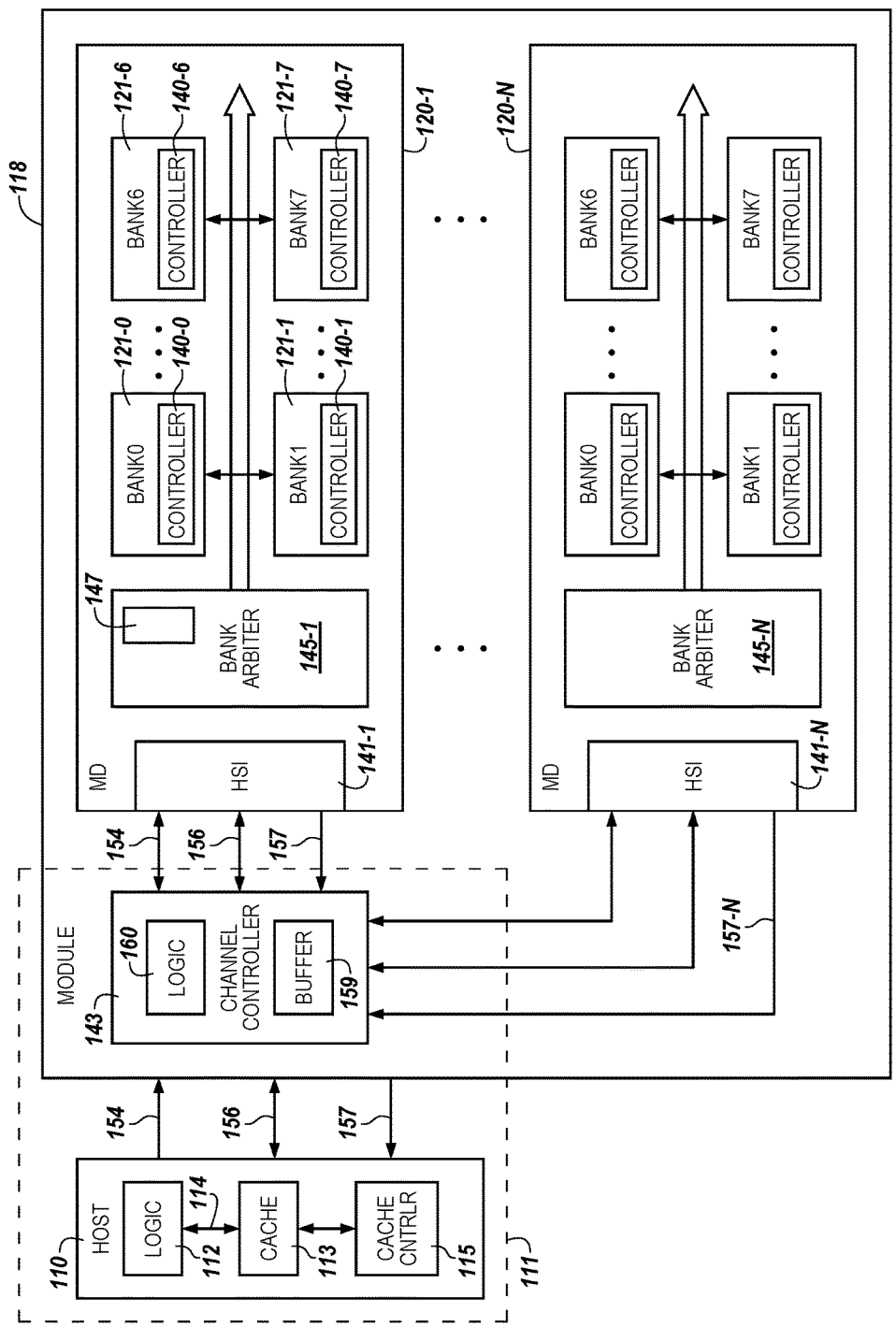
FIG. 1B is another block diagram of an apparatus in the form of a computing system including a memory device in accordance with a number of embodiments of the present disclosure.
Figure 1C:
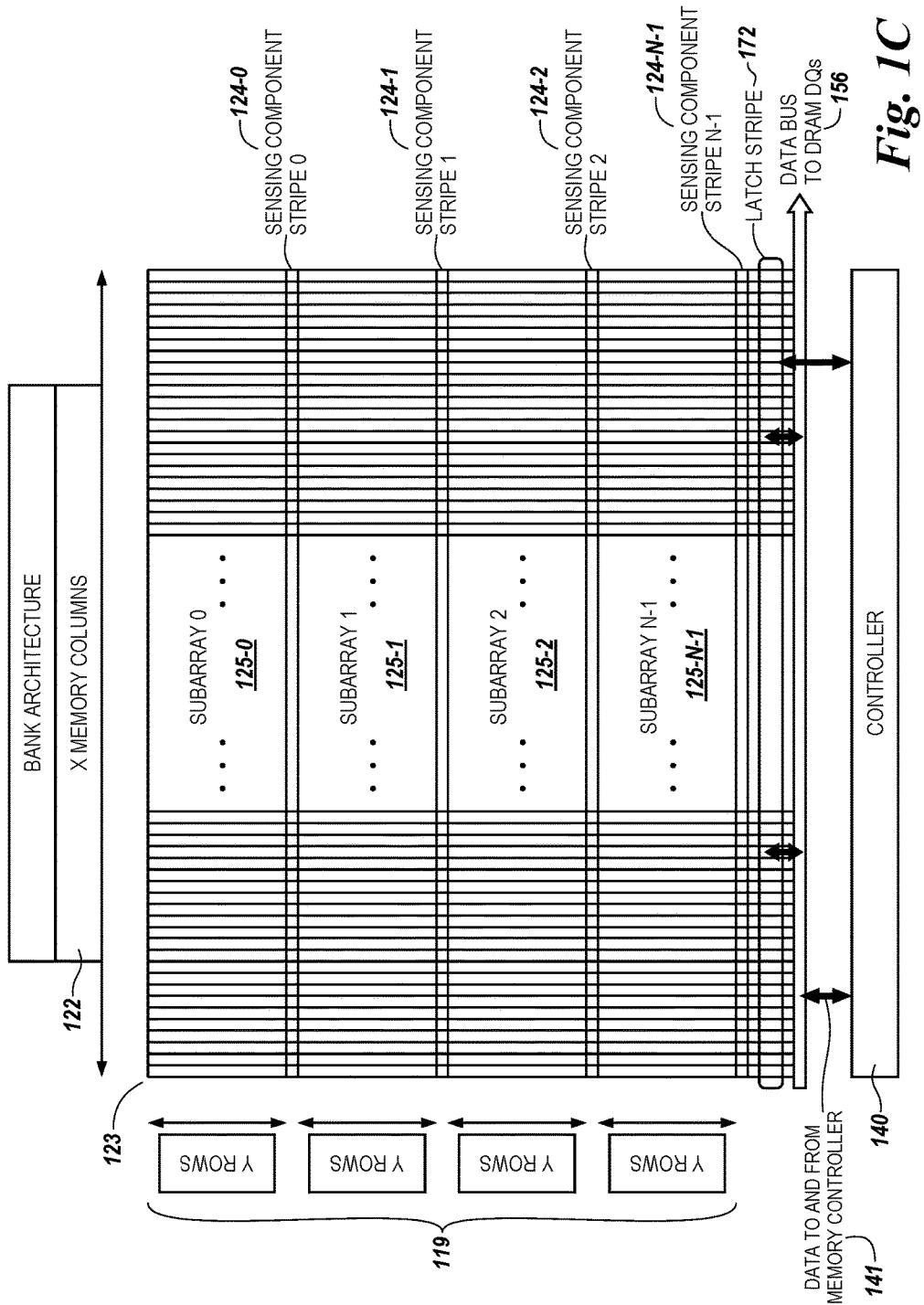
FIG. 1C is a block diagram of a bank section of a memory device in accordance with a number of embodiments of the present disclosure.
Figure 1D:
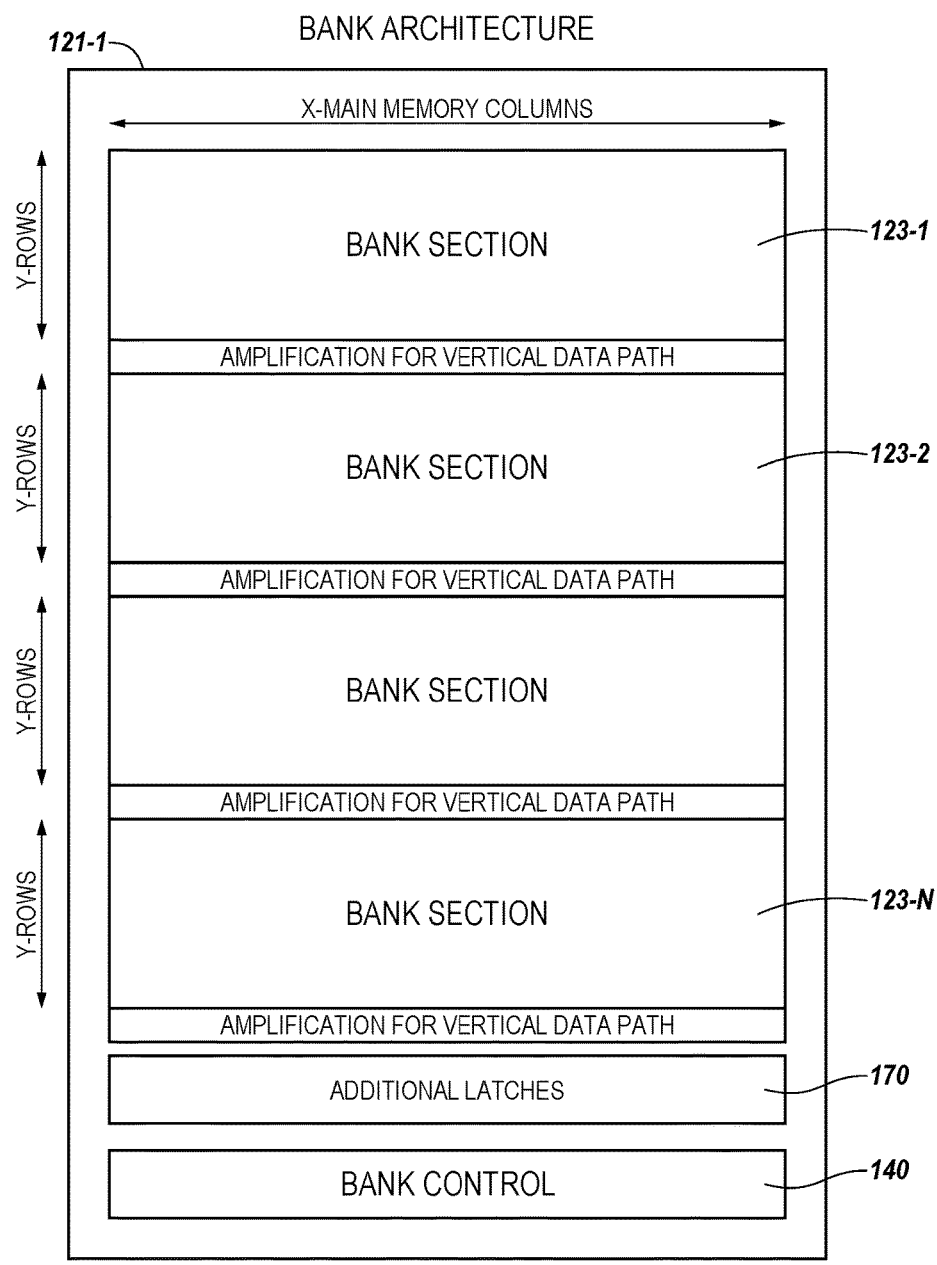
FIG. 1D is a block diagram of a bank of a memory device in accordance with a number of embodiments of the present disclosure.
Figure 2:
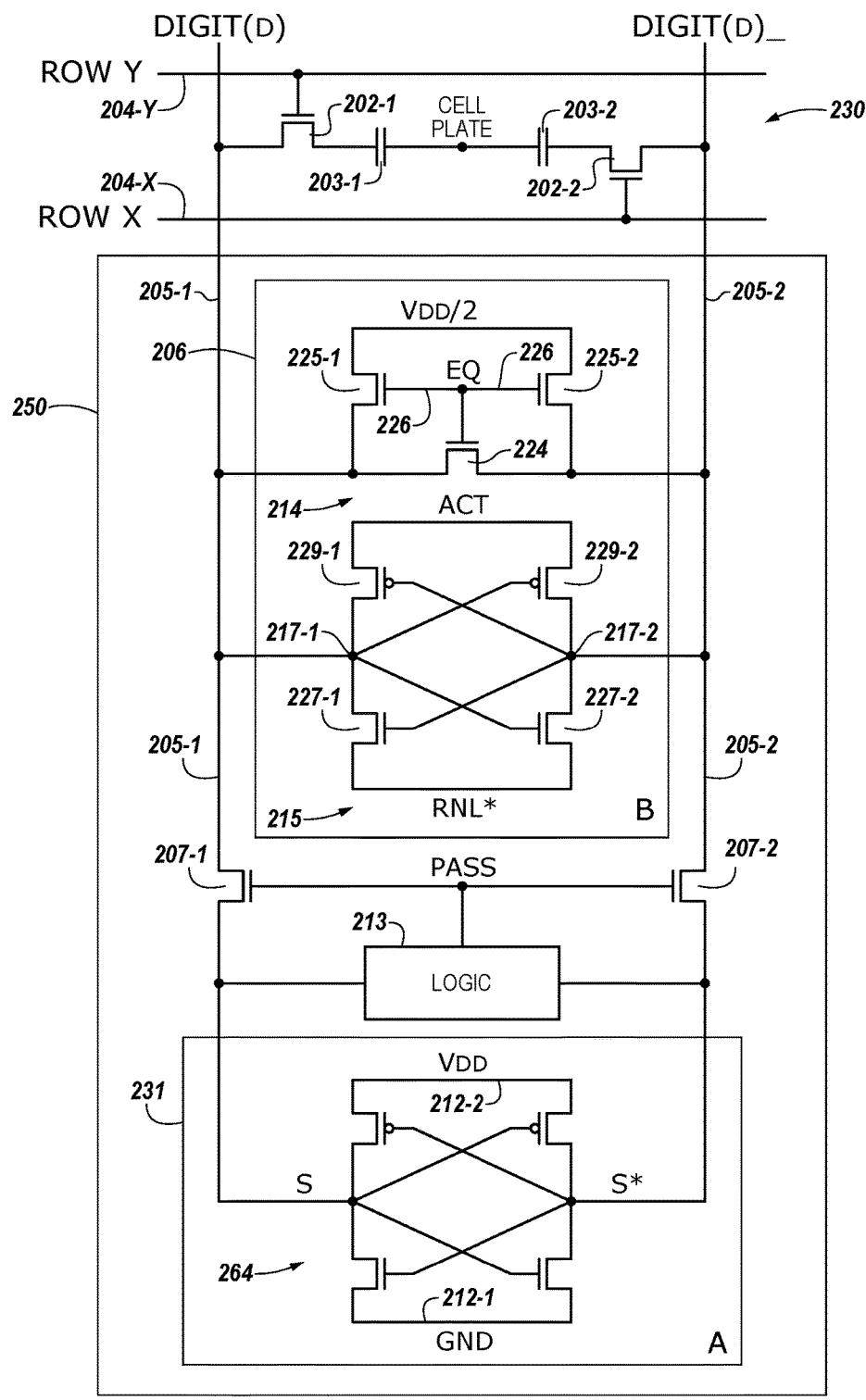
FIG. 2 is a schematic diagram illustrating sensing circuitry of a memory device in accordance with a number of embodiments of the present disclosure.
Figure 3:
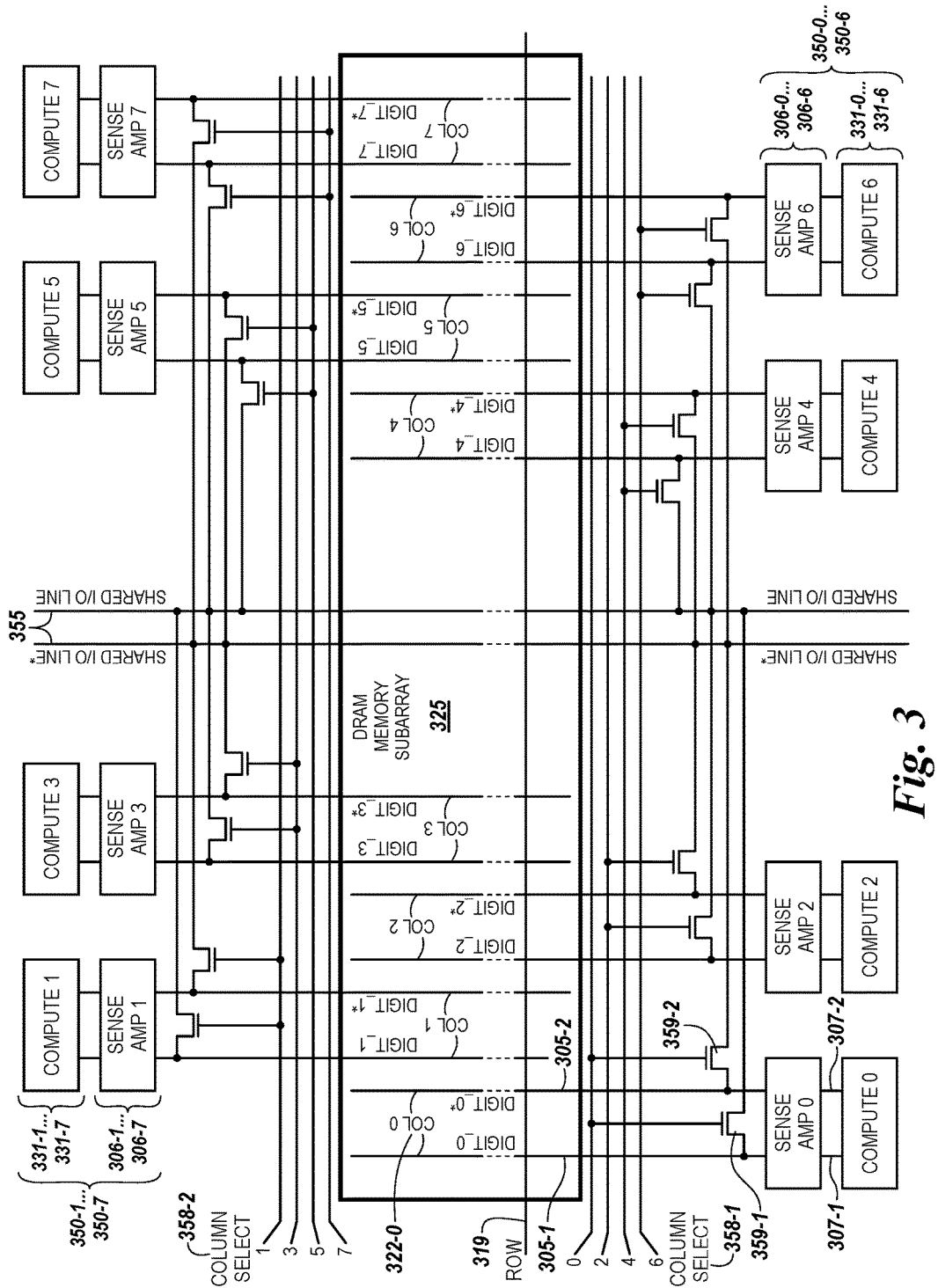
FIG. 3 is a schematic diagram illustrating circuitry for data movement in a memory device in accordance with a number of embodiments of the present disclosure.
Figure 4A:
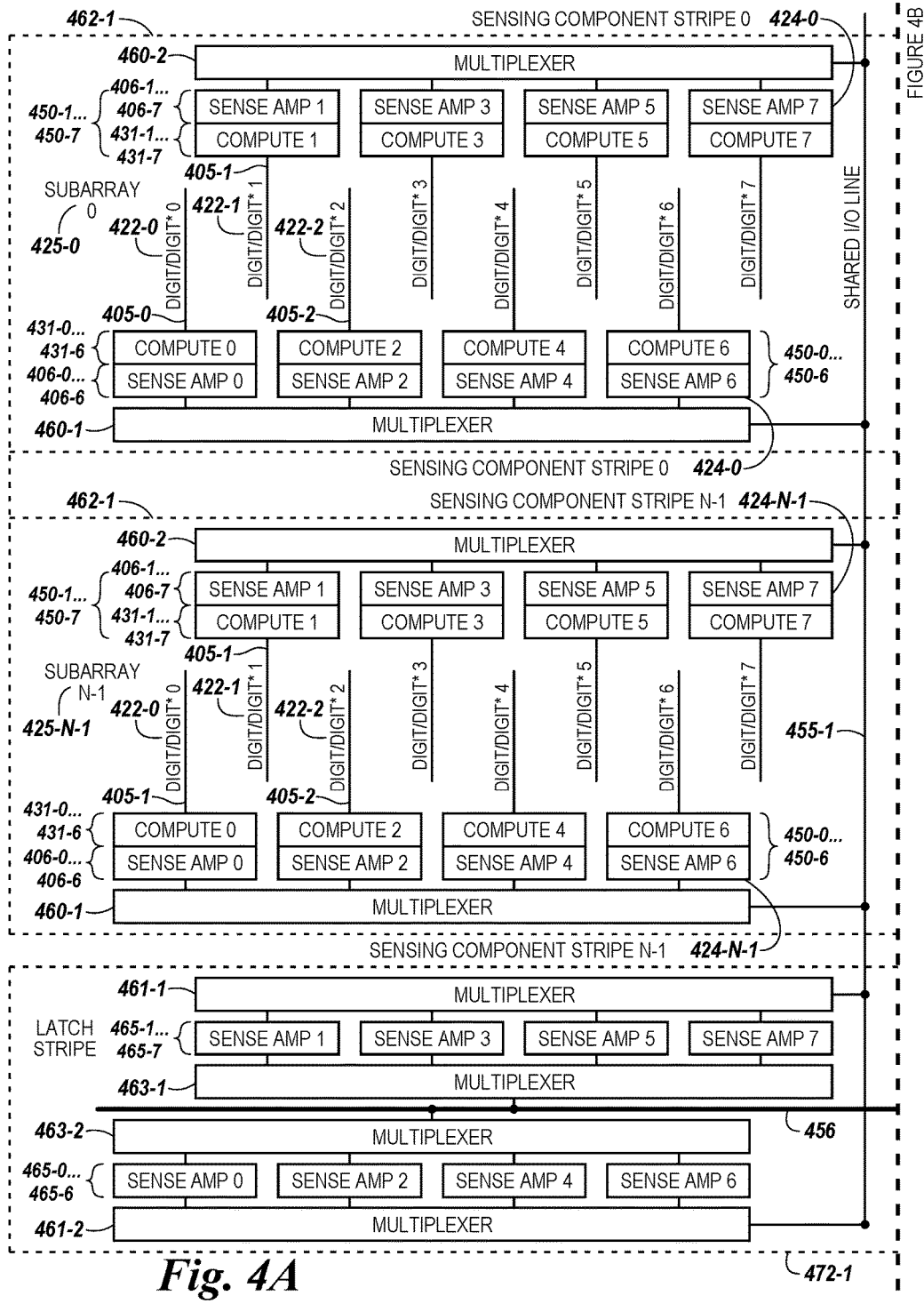
Figure 4B:
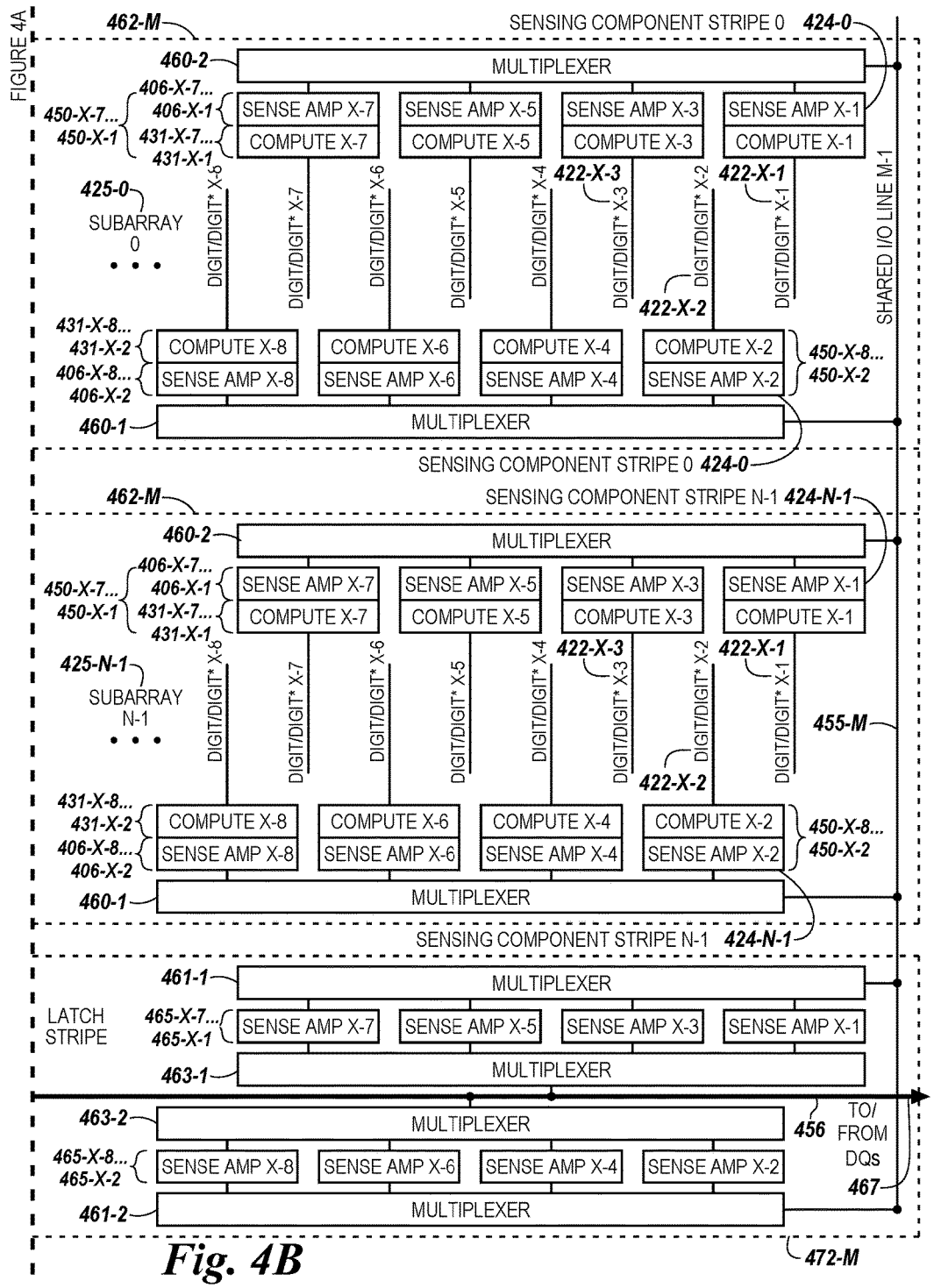

As used herein, the additional latches are intended to mean additional functionalities (e.g., peripheral amplifiers) that sense (e.g., read, store, cache) data values of memory cells in an array and that are distinct from the sense amplifiers of the sensing component stripes described herein (e.g., as shown at 206 in FIG. 2 and at corresponding reference numbers in FIGS. 3, 4A, and 4B). As such, the additional latches can be included in a "latch component 170". For example, latches 465, as shown in FIGS. 4A and 4B, and latches 470, as shown in FIG. 4C, of the latch component 170 can be located on a periphery of a bank 121 of the memory device, as shown for latch stripe 172 in FIG. 1C and latch component 170 in FIG. 1D. In contrast, the sense amplifiers located in a plurality of sensing component stripes 124 are physically associated with each subarray 125 of memory cells in the bank 121, as shown in FIGS. 1C and 1D.

The latch component 170 described herein can include the latch stripe(s) (e.g., as shown at 172 and corresponding reference numbers in FIGS. 4A-4C). The latch stripe(s) can, in various embodiments, include latches, which can be a number of sense amplifiers 465 (e.g., as shown in FIGS. 4A and 4B), or a number of sense amplifiers 465 combined with compute components 466 (e.g., as shown in FIG. 4C), and multiplexers 461 and 463 (e.g., as shown in FIGS. 4A-4C). The latches in the latch stripe(s) 472 and 473 can be selectably coupled, via the multiplexers 461, 463, to one or more data buses 456 in the bank for exchange (e.g., input and/or output) of data with a host 110, as shown in FIG. 1A.

System 100 in FIG. 1A includes the host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the examples shown in FIGS. 1A-1D illustrate a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, among other types of arrays. The array 130 can include memory cells arranged in rows coupled by access lines (which may be referred to herein as word lines or select lines) and columns coupled by sense lines (which may be referred to herein as data lines or digit lines). Although a single array 130 is shown in FIG. 1, embodiments are not so limited. For instance, memory device 120 may include a number of arrays 130 (e.g., a number of banks of DRAM cells, NAND flash cells, etc.).

The memory device 120 can include address circuitry 142 to latch address signals provided over a data bus 156 (e.g., an I/O bus connected to the host 110) by I/O circuitry 144 (e.g., provided to external ALU circuitry and/or to DRAM DQs via local I/O lines and global I/O lines). As used herein, DRAM DQs can enable input of data to and/or output of data from a bank (e.g., from and/or to the controller 140 and/or host 110) via a bus (e.g., data bus 156). During a write operation, a voltage (high=1, low=0) can be applied to a DQ (e.g., a pin). This voltage can be translated into an appropriate signal and stored in a selected memory cell. During a read operation, a data value read from a selected memory cell can appear at the DQ once access is complete and the output is enabled (e.g., by the output enable signal being low). At other times, DQs can be in a high impedance state, such that the DQs do not source or sink current and do not present a signal to the system. This also may reduce DQ contention when two or more devices (e.g., banks) share a combined data bus, as described herein.

Status and exception information can be provided from the controller 140 of the memory device 120 to a channel controller 143, for example, through a HSI out-of-band (OOB) bus 157, which in turn can be provided from the channel controller 143 to the host 110. The channel controller 143 can include a logic component 160 to allocate a plurality of locations (e.g., controllers for subarrays) in the arrays of each respective bank to store bank commands, application instructions (e.g., for sequences of operations), and arguments (PIM commands) for the various banks associated with operations of each of a plurality of memory devices (e.g., 120-1, . . . , 120-N as shown in FIG. 1B). The channel controller 143 can dispatch commands (e.g., PIM commands) to the plurality of memory devices 120-1, . . . , 120-N to store those program instructions within a given bank of a memory device.

Address signals are received through address circuitry 142 and decoded by a row decoder 146 and a column decoder 152 to access the memory array 130. Data can be sensed (read) from memory array 130 by sensing voltage and/or current changes on sense lines (digit lines) using a number of sense amplifiers, as described herein, of the sensing circuitry 150. A sense amplifier can read and latch a page (e.g., a row) of data from the memory array 130. Additional compute circuitry, as described herein, can be coupled to the sensing circuitry 150 and can be used in combination with the sense amplifiers to sense, store (e.g., cache and/or buffer), perform compute functions (e.g., operations), and/or move data. The I/O circuitry 144 can be used for bi-directional data communication with host 110 over the data bus 156 (e.g., a 64 bit wide data bus). The write circuitry 148 can be used to write data to the memory array 130.

Controller 140 (e.g., bank control logic and sequencer) can decode signals (e.g., commands) provided by control bus 154 from the host 110. These signals can include chip enable signals, write enable signals, and/or address latch signals that can be used to control operations performed on the memory array 130, including data sense, data store, data movement (e.g., copying, transferring, and/or transporting data values), data write, and/or data erase operations, among other operations. In various embodiments, the controller 140 can be responsible for executing instructions from the host 110 and accessing the memory array 130. The controller 140 can be a state machine, a sequencer, or some other type of controller. The controller 140 can control shifting data (e.g., right or left) in a row of an array (e.g., memory array 130).

Examples of the sensing circuitry 150 are described further below (e.g., in FIGS. 2 and 3). For instance, in a number of embodiments, the sensing circuitry 150 can include a number of sense amplifiers and a number of compute components, which may serve as an accumulator and can be used to perform operations in each subarray (e.g., on data associated with complementary sense lines).

In a number of embodiments, the sensing circuitry 150 can be used to perform operations using data stored in memory array 130 as inputs and participate in movement of the data for copy, transfer, transport, writing, logic, and/or storage operations to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and/or other processing circuitry, such as ALU circuitry, located on device 120, such as on controller 140 or elsewhere).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. The latch component 170 can include latches, as described herein, and can be coupled to the sensing circuitry 150 via a shared I/O line.

For example, the sensing circuitry 150 described herein can be formed on a same pitch as a pair of complementary sense lines. As an example, a pair of complementary memory cells may have a cell size with a $6F^2$ pitch (e.g., $3F \times 2F$), where F is a feature size. If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

Furthermore, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. The data may be processed by a processing resource associated with a host, for instance, rather than on pitch with the memory.

In contrast, a number of embodiments of the present disclosure can include the sensing circuitry 150 (e.g., including sense amplifiers and/or compute components) being formed on pitch with the memory cells of the array. The sensing circuitry 150 can be configured for (e.g., capable of) performing compute functions (e.g., logical operations).

As such, in a number of embodiments, circuitry external to array 130 and sensing circuitry 150 is not needed to perform compute functions as the sensing circuitry 150 can perform the appropriate operations to perform such compute functions without the use of an external processing resource. Therefore, the sensing circuitry 150 may be used to complement or to replace, at least to some extent, such an external processing resource (or at least the bandwidth consumption of such an external processing resource).

However, in a number of embodiments, the sensing circuitry 150 may be used to perform operations (e.g., to execute instructions) in addition to operations performed by an external processing resource (e.g., host 110). For instance, host 110 and/or sensing circuitry 150 may be limited to performing only certain operations and/or a certain number of operations.

PIM capable device operations can use bit vector based operations. As used herein, the term "bit vector" is intended to mean a physically contiguous number of bits on a bit vector memory device (e.g., a PIM device) stored physically contiguous in a row of an array of memory cells. Thus, as used herein a "bit vector operation" is intended to mean an operation that is performed on a bit vector that is a contiguous portion of virtual address space (e.g., used by a PIM device). For example, a row of virtual address space in the PIM device may have a bit length of 16K bits (e.g., corresponding to 16K complementary pairs of memory cells in a DRAM configuration). Sensing circuitry 150, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element on a single bit of the bit vector of the row of memory cells sensed by the sensing circuitry 150 (e.g., sensed by and/or stored in a sense amplifier paired with the compute component, as described herein).

Enabling an I/O line can include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform operations without enabling column decode lines of the array; however, the local I/O line(s) may be enabled in order to transfer a result to a suitable location other than back to the array 130 (e.g., to an external register).

FIG. 1A can represent an apparatus architecture in the form of a computing system 100 including a memory device 120 having a plurality of banks (e.g., 121-0, . . . , 121-N as shown in FIG. 1B) coupled to the host 110 via the channel controller 143. In at least one embodiment, the channel controller 143 may be coupled to and integrated with the plurality of banks of the memory device 120 and/or the channel controller 143 may be coupled to and integrated with the host 110. The channel controller 143 can be coupled to each of the plurality of banks of the memory device via an address and control (A/C) bus 154, which in turn can be coupled to the host 110. The channel controller 143 can also be coupled to each of the plurality of banks via a combined data bus 156, which in turn can be coupled to the host 110. In addition, the channel controller 143 can be coupled to each of the plurality of banks via an OOB bus 157 associated with the HSI 141, also referred to herein as a status channel interface, which is configured to report status, exception and other data information to the channel controller 143 to exchange with the host 110.

As shown in FIG. 1A, the channel controller 143 can receive the status and exception information from the HSI 141 associated with a bank arbiter 145 associated with each of the plurality of banks. The bank arbiter 145 can sequence control and data with the plurality of banks (e.g., Bank zero (0), Bank one (1), . . . , Bank six (6), Bank seven (7), etc., as shown in FIG. 1B). A controller 140 can be associated with each particular bank (e.g., Bank 0, . . . , Bank 7) in a given memory device 120 and can decode signals provided by control bus 154 from the host 110. Each of the plurality of banks can include the controller 140 and other components, including an array of memory cells 130 and sensing circuitry 150, latch component 170, and/or data movement components 171, etc.

For example, each of the plurality of banks (e.g., in a plurality of memory devices 120-1, 120-2, . . . , 120-N each having a plurality of banks as shown in FIG. 1B) can include address circuitry 142 to latch address signals provided over a portion of a combined data bus 156 (e.g., an I/O bus) through I/O circuitry 144. Status and/or exception information can be provided from the controller 140 associated with (e.g., formed on the same chip as the memory cells in the subarrays) each bank to the channel controller 143, using the OOB bus 157, which in turn can be provided from the plurality of banks to the host 110. For each of the plurality of banks (e.g., Bank 0, . . . , Bank 7) address signals can be received through address circuitry 142 and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status and/or exception information to the channel controller 143.

In some embodiments, the channel controller 143 can dispatch commands to the plurality of banks (e.g., Bank 0, . . . , Bank 7) and field return results and/or data from such operations. As described herein, the return results and/or data can be returned to the channel controller 143 via the OOB bus 157 associated with the status channel interface on each of the plurality of banks.

FIG. 1B is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment, the channel controller 143 may be coupled to the plurality of memory devices 120-1, . . . , 120-N in an integrated manner in the form of a module 118 (e.g., formed on same chip with the plurality of memory devices 120-1, . . . , 120-N). In an alternative embodiment, the channel controller 143 may be integrated with the host 110, as illustrated by dashed lines 111 (e.g., formed on a separate chip from the plurality of memory devices 120-1, . . . , 120-N).

As shown in FIG. 1B, the channel controller 143 can receive the status and/or exception information from a HSI 141 (also referred to herein as a status channel interface) associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks (e.g., Bank 0, . . . , Bank 7, etc.). Each of the plurality of banks can include a controller 140 and other components, including an array of memory cells 130 and sensing circuitry 150, logic circuitry 170, etc., as described in connection with FIG. 1A.

The channel controller 143 can include one or more local buffers 159 to store program instructions and can include logic 160 to allocate a plurality of locations (e.g., subarrays or portions of subarrays) in the arrays of each respective bank to store bank commands, and arguments (e.g., PIM commands) for the various banks associated with operation of each of the plurality of memory devices 120-1, . . . , 120-N. The channel controller 143 can dispatch commands (e.g., PIM commands) to the plurality of memory devices 120-1, . . . , 120-N to store those program instructions within a given bank of a memory device.

As in FIG. 1A, a controller 140 (e.g., bank control logic and/or sequencer) associated with any subarray in a particular bank (e.g., Bank 0, . . . , Bank 7, etc.) in a given memory device (e.g., 120-1, . . . , 120-N) can decode signals provided by control bus 154 from the host 110. These signals can include chip enable signals, write enable signals, and/or address latch signals that are used to control operations performed on the memory array 130, including data read, data write, data copy, data movement, and/or data erase operations. In various embodiments, the controller 140 is responsible for executing instructions from the host 110.

FIG. 1C is a block diagram of a bank section 123 of a memory device in accordance with a number of embodiments of the present disclosure. For example, bank section 123 can represent an example section of a number of bank sections of a bank of a memory device (e.g., bank section 0, bank section 1, . . . , bank section M-1). As shown in FIG. 1C, a bank section 123 can include a plurality of memory columns 122 shown horizontally as X (e.g., 4096, 8192, or 16,384 columns, among various possibilities, in an example DRAM bank and bank section). Additionally, the bank section 123 may be divided into subarray 0, subarray 1, . . . , and subarray N-1 (e.g., 32, 64, or 128 subarrays, among various possibilities) shown at 125-0, 125-1, . . . , 125-N-1, respectively, that are separated by amplification regions configured to be coupled to a data path. As such, the subarrays 125-0, 125-1, . . . , 125-N-1 can each have amplification regions 124-0, 124-1, . . . , 124-N-1 that correspond to sensing component stripe 0, sensing component stripe 1, . . . , and sensing component stripe N-1, respectively.

Each column 122 is configured to be coupled to sensing circuitry 150, as described in connection with FIG. 1A and elsewhere herein. As such, each column in a subarray can be coupled individually to a sense amplifier that contributes to a sensing component stripe for that subarray. For example, as shown in FIG. 1C, the bank section 123 can include sensing component stripe 0, sensing component stripe 1, ..., sensing component stripe N-1 that each have sensing circuitry 150 with sense amplifiers that can, in various embodiments, be used as registers, cache and/or data buffering and that are coupled to each column 122 in the subarrays 125-0, 125-1, ..., 125-N-1.

Each of the of the subarrays 125-0, 125-1, ..., 125-N-1 can include a plurality of rows 119 shown vertically as Y (e.g., each subarray may include 256, 512, 1024 rows, among various possibilities, in an example DRAM bank). Example embodiments are not limited to the example horizontal and vertical orientation of columns and rows described herein or the example numbers thereof.

The latch component 170 associated with the sensing circuitry 150 coupled to the memory array 130, as shown in FIG. 1A, can complement and can be connected (e.g., selectably coupled) to the data movement components 171 associated with the controller 140. The sense amplifiers that sense data values in memory cells of the subarrays are located in a plurality of sensing component stripes 124 that are each physically associated with a subarray 125 of memory cells in the bank section 123 shown in FIG. 1C.

In contrast, the latch component 170 configured to receive moved data values, store the moved data values, and/or enable access to and further movement of the data values (e.g., by and/or to the controller 140 and/or the host 110) from the bank section 123 includes a plurality of latches located in a number of latch stripes 172 (e.g., 1-8 latch stripes, among other possibilities, as described herein) on a periphery of the bank section 123. The plurality of latches can each be configured with a store (cache) for data values. For example, the data values (e.g., some or all of the data values in a row) can be moved from a row 119 in response to access of the row during a read and/or write operation. Each column 122 can be configured to be coupled to latches in the latch stripe 172 (e.g., via a plurality of shared I/O lines, as described herein). As such, each column in the bank can be coupled individually to a latch that contributes to a latch stripe 172 for that bank. Each bank 121-1, ..., 121-N of the memory array 130 can be configured to include at least one of its own latch stripes 172.

As shown in FIG. 1C, the bank section 123 can be associated with controller 140. The controller 140 shown in FIG. 1C can, in various examples, represent at least a portion of the functionality embodied by and contained in the controllers 140 shown in FIGS. 1A and 1B. The controller 140 can direct (e.g., control) input of commands and data 141 to the section 123 and output (e.g., movement) of data from the bank section 123 (e.g., to the host 110) along with control of data movement in the section 123, as described herein. The bank section 123 can include a data bus 156 (e.g., a 64 bit wide data bus) to DRAM DQs, which can correspond to the data bus 156 described in connection with FIG. 1A. Each data bus 156 for each bank (e.g., 121-0, ..., 121-7) of subarrays (e.g., 125-0, 125-1, ..., 125-N-1) can be referred to as a portion of a data bus that contributes to formation of a combined data bus (e.g., as described in connection with FIG. 1B for a plurality of banks and/or memory devices). As such, in some embodiments, eight 64 bit wide data bus portions for eight banks can contribute to a 512 bit wide combined data bus.

FIG. 1D is a block diagram of a bank 121-1 of a memory device in accordance with a number of embodiments of the present disclosure. For example, bank 121-1 can represent an example bank of a memory device 120, such as Bank 0, ..., Bank 7 (121-0, ..., 121-7) described in connection with FIG. 1B. As shown in FIG. 1D, a bank 121-1 can include a plurality of main memory columns (shown horizontally as X) (e.g., 16,384 columns in an example DRAM bank). Additionally, the bank 121-1 may be divided up into bank sections (e.g., of subarrays), 123-1, 123-2, ..., 123-N, separated by amplification regions for a data path (e.g., amplification regions 124-0, 124-1, ..., 124-N-1 that correspond to sensing component stripe 0, sensing component stripe 1, ..., and sensing component stripe N-1 in FIG. 1C). Each of the of the bank sections 123-1, ..., 123-N can include a plurality of rows (shown vertically as Y) (e.g., each section may include 16 subarrays that each may include 256, 512, or 1024 rows in an example DRAM bank). Example embodiments are not limited to the example horizontal and/or vertical orientation of columns and rows described here or the example numbers thereof.

As shown in FIG. 1D, the bank 121-1 can include a latch component 170, including latches that each can operate as a cache for a data value, that is coupled to the bank sections 123-1, ..., 123-N. The latch component 170 can represent another example of the latch component 170 selectably coupled to the sensing circuitry 150 coupled to the memory array 130 (e.g., a bank thereof) and the controller 140 shown in FIG. 1A and/or the latch stripe 172 associated with the subarrays 125-0, 125-1, ..., 125-N-1 and the controller 140 shown in FIG. 1C. Further, as shown in FIG. 1D, the bank 121-1 can be associated with bank control (e.g., controller 140). The bank control shown in FIG. 1D can, for example, represent at least a portion of the functionality embodied by and contained in the controller/sequencer 140 shown in FIGS. 1A-1C.

FIG. 2 is a schematic diagram illustrating sensing circuitry 250 in accordance with a number of embodiments of the present disclosure. The sensing circuitry 250 can correspond to sensing circuitry 150 shown in FIG. 1A.

A memory cell can include a storage element (e.g., capacitor) and an access device (e.g., transistor). For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

The cells of the memory array 230 can be arranged in rows coupled by access (word) lines 204-X (Row X), 204-Y (Row Y), etc., and columns coupled by pairs of complementary sense lines (e.g., digit lines DIGIT(D) and DIGIT (D)_ shown in FIG. 2 and DIGIT_ and DIGIT_0* shown in FIGS. 3 and 4A-4B). The individual sense lines corresponding to each pair of complementary sense lines can also be referred to as digit lines 205-1 for DIGIT (D) and 205-2 for DIGIT (D)_, respectively, or corresponding reference numbers in FIGS. 3 and 4A-4B. Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells (e.g., coupled to respective pairs of complementary digit lines). The sense amplifier 206 can be coupled to the pair of complementary digit lines 205-1 and 205-2. The compute component 231 can be coupled to the sense amplifier 206 via pass gates 207-1 and 207-2. The gates of the pass gates 207-1 and 207-2 can be coupled to operation selection logic 213.

The operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 can also be coupled to the pair of complementary digit lines 205-1 and 205-2. The operation selection logic 213 can be configured to control continuity of pass gates 207-1 and 207-2 based on a selected operation.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines D 205-1 and (D)_ 205-2. However, embodiments are not limited to this example. The latch 215 can be a cross coupled latch (e.g., gates of a pair of transistors) such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as the primary latch.

In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal and an RNL* signal can be driven low to enable (e.g., fire) the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{CC}$ through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell.

Embodiments are not limited to the sense amplifier 206 configuration illustrated in FIG. 2. As an example, the sense amplifier 206 can be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 can, in conjunction with the compute component 231, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 206 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., $V_{CC}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) can be operated to perform a selected operation and initially store the result in one of the sense amplifier 206 or the compute component 231 without transferring data from the sensing circuitry via a local or global I/O line (e.g., without performing a sense line address access via activation of a column decode signal, for instance).

Performance of operations (e.g., Boolean logical operations involving data values) is fundamental and commonly used. Boolean logical operations are used in many higher level operations. Consequently, speed and/or power efficiencies that can be realized with improved operations, can translate into speed and/or power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

As described herein, a memory device (e.g., 120 in FIG. 1A) can be configured to couple to a host (e.g., 110) via a data bus (e.g., 156) and a control bus (e.g., 154). A bank 121 in the memory device (e.g., bank section 123 in FIG. 1C) can include a plurality of subarrays (e.g., 125-0, 125-1, . . . , 125-N-1 in FIG. 1C) of memory cells. The bank 121 can include sensing circuitry (e.g., 150 in FIG. 1A and corresponding reference numbers in FIGS. 2, 3, 4A and 4B) coupled to the plurality of subarrays via a plurality of columns (e.g., 122 in FIG. 1C) of the memory cells. The sensing circuitry can include a sense amplifier and a compute component (e.g., 206 and 231, respectively, in FIG. 2) coupled to each of the columns.

The bank 121 can include a plurality of sensing component stripes (e.g., 124-0, 124-1, . . . , 124-N-1 in FIG. 1C) each with sensing circuitry coupled to a respective subarray of the plurality of the subarrays. A controller (e.g., 140 in FIGS. 1A-1C) coupled to the bank can be configured to direct, as described herein, movement of data values stored in a first subarray (e.g., from data values in a row of the subarray sensed (cached) by the coupled sensing component stripe) to be stored in latches (e.g., 465 in FIGS. 4A and 4B and/or 470 in FIG. 4C) of a latch stripe (e.g., 172 in FIG. 1C) and/or a latch component (e.g., 170 in FIG. 1D). Moving (e.g., copying, transferring, and/or transporting) data values between sense amplifiers and/or compute components (e.g., 206 and 231, respectively, in FIG. 2) in a sensing component stripe and corresponding sense amplifiers and/or compute components (e.g., 465 and 466, respectively, in FIGS. 4A-4C) that form latches in a latch stripe can be enabled by a number of selectably coupled I/O lines (e.g., 355 in FIG. 3 and 455-1 through 455-M in FIGS. 4A-4C) shared by the sensing component stripe and the latch stripe, as described herein.

The memory device can include a sensing component stripe (e.g., 124 in FIG. 1C and 424 in FIGS. 4A and 4B) configured to include a number of a plurality of sense amplifiers and compute components (e.g., 306-0, 306-1, . . . , 306-7 and 331-0, 331-1, . . . , 331-7, respectively, as shown in FIG. 3) that can correspond to a number of the plurality of columns (e.g., 122 in FIG. 1C and 305-1 and 305-2 in FIG. 3) of the memory cells, where the number of sense amplifiers and/or compute components can be selectably coupled to the plurality of shared I/O lines (e.g., via column select circuitry 358-1 and 358-2). The column select circuitry can be configured to selectably sense data in a particular column of memory cells of a subarray by being selectably coupled to a plurality of (e.g., four, eight, and sixteen, among other possibilities) sense amplifiers and/or compute components.

In some embodiments, a number of a plurality of sensing component stripes (e.g., 124-0, . . . , 124-N-1 in FIG. 1C) in the bank can correspond to a number of the plurality of subarrays (e.g., 125-0, 125-1, . . . , 125-N-1 in FIG. 1C) in the bank. A sensing component stripe can include a number of sense amplifiers and/or compute components configured to move (e.g., copy, transfer, and/or transport) an amount of data sensed from a row of the first subarray in parallel to a plurality of shared I/O lines. In some embodiments, the amount of data can correspond to at least a thousand bit width of the plurality of shared I/O lines.

As described herein, the array of memory cells can include an implementation of DRAM memory cells where the controller is configured, in response to a command, to move (e.g., copy, transfer, and/or transport) data from the source location to the destination location via a shared I/O line. In various embodiments, the source location can be in a first bank and the destination location can be in a second bank in the memory device and/or the source location can be in a first subarray of one bank in the memory device and the destination location can be in a second subarray of the same bank. The first subarray and the second subarray can be in the same section of the bank or the subarrays can be in different sections of the bank.

As described herein, the apparatus can be configured to move (e.g., copy, transfer, and/or transport) data from a source location, including a particular row (e.g., 319 in FIG. 3) and column address associated with a first number of sense amplifiers and compute components (e.g., 406-0 and 431-0, respectively, in subarray 0 (425-0)) to a shared I/O line (e.g., 455-1). In addition, the apparatus can be configured to move the data to a destination location, including a particular row and column address associated with a second number of sense amplifiers and compute components (e.g., 406-0 and 431-0, respectively, in subarray N-1 (425-N-1) using the shared I/O line (e.g., 455-1). As the reader will appreciate, each shared I/O line (e.g., 455-1) can actually include a complementary pair of shared I/O lines (e.g., shared I/O line and shared I/O line* as shown in the example configuration of FIG. 3). In some embodiments described herein, 2048 shared I/O lines (e.g., complementary pairs of shared I/O lines) can be configured as a 2048 bit wide shared I/O line.

As described herein, a memory device can include a latch selectably coupled to a column of the memory cells and configured to store (e.g., cache) a data value moved from the sensing circuitry. The memory device can include a controller configured to direct movement of the data value from the sensing circuitry (e.g., in the sensing component stripe) to the latch (e.g., in a latch stripe). In some embodiments, the latch can be configured to selectably couple to the controller (e.g., via shared, local, and/or global I/O lines, as described herein) to enable access by the controller to the data value stored in the latch.

A latch component, including the latch, can be formed on a periphery of a bank (e.g., as shown at 172 in FIG. 1C and/or at 170 in FIG. 1D). In contrast, the sensing circuitry can be included in a plurality of sensing component stripes, where each sensing component stripe can be physically associated with a respective subarray of the plurality of subarrays in the bank (e.g., as shown at sensing component stripes 124-0, 124-1, . . . , 124-N-1 and subarrays 125-0, 125-1, . . . , 125-N-1 in FIG. 1C).

The latch can be further configured to enable an operation to be performed on the data value stored in the latch. For example, as shown in FIG. 4C, a latch 470 can include a sense amplifier 465 to store a data value moved via a shared I/O line (e.g., 455-M) and a compute component 466 to enable performance of the operation, as described herein. The data value on which an operation has been performed may, as a result, differ from the moved data value (e.g., the data value stored in the latch via input from the shared I/O line).

A number of latches can be formed in a bank (e.g., 121-1 in FIG. 1D) of the memory device (e.g., 120 in FIG. 1A). Each latch can be configured to selectably couple to a data bus (e.g., as described in connection with 156 in FIG. 1B and 456 in FIGS. 4A-4C) associated with the bank to output a stored data value from the latch to a host 110. In some embodiments, the data value moved to the latch from a selected subarray (e.g., a data value stored in selected memory cell in a selected row of the subarray) can be a copy of the data value that remains stored in the selected subarray. Hence, the memory device can be configured to perform an operation (e.g., in the sensing circuitry of the sensing component stripe) on the data value stored in the selected subarray in parallel with (e.g., at substantially the same point in time) output to the host, via the data bus, of the data value stored in the latch. As described herein, the data value stored in the latch can be a sensed data value moved from the sensing circuitry coupled to the selected subarray to the latch.

Memory devices (e.g., memory devices 120-1, . . . , 120-N in FIG. 1B) can, as described herein, include a plurality of banks (e.g., banks 121-0, 121-1, . . . , 121-7 in FIG. 1B). Each bank of the plurality of banks can be configured to selectably couple to the host via a portion of the data bus (e.g., 156 and 456) that can be configured as a combined data bus for the plurality of banks. The host can be configured to direct movement of the data value from the latch in a first bank (e.g., the data value moved to the latch component in the first bank from corresponding sensing circuitry in the respective sensing component stripe) to a second bank in the plurality of banks via the combined data bus. A controller in the second bank can, in various embodiments, be configured to direct movement of the data value to one or more selected subarrays (e.g., a selected memory cell in one or more selected rows of the selected subarrays) of the second bank.

Movement of a data value, as described herein, can include movement of a copy of the data value from a source location to a destination location. For example, a number of data values can be copied and moved to latches of a destination latch stripe and the original data values can remain stored (e.g., unchanged) in a source row of the subarray. In various embodiments, the source location and/or the destination location can be a host, a selected bank, a selected DQ for a selected bank, a selected controller for a selected bank, a portion of a combined data bus for a selected bank, the combined data bus for a plurality of banks, a selected subarray, memory cells of a selected row of a subarray, the sensing circuitry, a sensing component stripe of a selected subarray, a latch, a latch stripe, and/or a latch component, among other possible source and/or the destination locations described herein. In some embodiments, a data value can be transferred from the source location to the destination location. For example, when the data values stored (cached) in the sensing component stripe are copied and moved to the latch component, at least one of the original data values stored in the row of the subarray may be changed (e.g., by being erased and/or by a subsequent write operation, as described herein).

FIG. 3 is a schematic diagram illustrating circuitry for data movement in a memory device in accordance with a number of embodiments of the present disclosure. FIG. 3 shows eight sense amplifiers (e.g., sense amplifiers 0, 1, . . . , 7 shown at 306-0, 306-1, . . . , 306-7, respectively) each coupled to a respective pair of complementary sense lines (e.g., digit lines 305-1 and 305-2). FIG. 3 also shows eight compute components (e.g., compute components 0, 1, . . . , 7 shown at 331-0, 331-1, . . . , 331-7) each coupled to a respective sense amplifier (e.g., as shown for sense amplifier 0 at 306-0) via respective pass gates 307-1 and 307-2 and digit lines 305-1 and 305-2. For example, the pass gates can be connected as shown in FIG. 2 and can be controlled by an operation selection signal, Pass. For example, an output of the selection logic can be coupled to the gates of the pass gates 307-1 and 307-2 and digit lines 305-1 and 305-2. Corresponding pairs of the sense amplifiers and compute components can contribute to formation of the sensing circuitry indicated at 350-0, 350-1, . . . , 350-7.

Data values present on the pair of complementary digit lines 305-1 and 305-2 can be loaded into the compute component 331-0 as described in connection with FIG. 2. For example, when the pass gates 307-1 and 307-2 are enabled, data values on the pair of complementary digit lines 305-1 and 305-2 can be passed from the sense amplifiers to the compute component (e.g., 306-0 to 331-0). The data values on the pair of complementary digit lines 305-1 and 305-2 can be the data value stored in the sense amplifier 306-0 when the sense amplifier is fired.

The sense amplifiers 306-0, 306-1, . . . , 306-7 in FIG. 3 can each correspond to sense amplifier 206 shown in FIG. 2. The compute components 331-0, 331-1, . . . , 331-7 shown in FIG. 3 can each correspond to compute component 231 shown in FIG. 2. A combination of one sense amplifier with one compute component can contribute to the sensing circuitry (e.g., 350-0, 350-1, . . . , 350-7) of a portion of a DRAM memory subarray 325 configured to an I/O line 355 shared by a number of sensing component stripes for subarrays and/or latch components, as described herein. The paired combinations of the sense amplifiers 306-0, 306-1, . . . , 306-7 and the compute components 331-0, 331-1, . . . , 331-7, shown in FIG. 3, can be included in the sensing component stripe, as shown at 124 in FIG. 1C and at 424 in FIGS. 4A and 4B.

Sense amplifiers 465-0, 465-1, . . . , 465-X-1 of an embodiment of a latch stripe 472 are shown in FIGS. 4A and 4B. Combinations of the sense amplifiers 465-0, 465-1, . . . , 465-X-1 and compute components 466-0, 466-1, . . . , 466-X-1 can be included in another embodiment of the latch component stripe 473, as shown in FIG. 4C. The sense amplifiers 465-0, 465-1, . . . , 465-X-1 can be configured and/or can have functionality similar to or the same as the sense amplifiers 306-0, 306-1, . . . , 306-7 and/or the compute components 466-0, 466-1, . . . , 466-X-1 can be configured and/or can have functionality similar to or the same as the compute components 331-0, 331-1, . . . , 331-7 shown in FIGS. 3, 4A, and 4B and described in connection with FIG. 2.

The configurations of embodiments illustrated in FIG. 3 are shown for purposes of clarity and are not limited to these configurations. For instance, the configuration illustrated in FIG. 3 for the sense amplifiers 306-0, 306-1, . . . , 306-7 in combination with the compute components 331-0, 331-1, . . . , 331-7 and the shared I/O line 355 is not limited to half the combination of the sense amplifiers 306-0, 306-1, . . . , 306-7 with the compute components 331-0, 331-1, . . . , 331-7 of the sensing circuitry being formed above the columns 322 of memory cells (not shown) and half being formed below the columns 322 of memory cells. Nor are the number of such combinations of the sense amplifiers with the compute components forming the sensing circuitry configured to couple to a shared I/O line limited to eight. In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and the compute components forming the sensing circuitry (e.g., rather than being at either end of the combination of the sense amplifiers and the compute components).

The circuitry illustrated in FIG. 3 also shows column select circuitry 358-1 and 358-2 that is configured to implement data movement operations with respect to particular columns 322 of a subarray 325, the complementary digit lines 305-1 and 305-2 associated therewith, and the shared I/O line 355 (e.g., as directed by the controller 140 shown in FIGS. 1A-1D). For example, column select circuitry 358-1 has select lines 0, 2, 4, and 6 that are configured to couple with corresponding columns, such as column 0 (332-0), column 2, column 4, and column 6. Column select circuitry 358-2 has select lines 1, 3, 5, and 7 that are configured to couple with corresponding columns, such as column 1, column 3, column 5, and column 7. The column select circuitry 358 described in connection with FIG. 3 can, in various embodiments, represent at least a portion of the functionality embodied by and contained in the multiplexers 460 described in connection with FIGS. 4A and 4B.

Controller 140 can be coupled to column select circuitry 358 to control select lines (e.g., select line 0) to access data values stored in the sense amplifiers, compute components, and/or present on the pair of complementary digit lines (e.g., 305-1 and 305-2 when selection transistors 359-1 and 359-2 are activated via signals from select line 0). Activating the selection transistors 359-1 and 359-2 (e.g., as directed by the controller 140) enables coupling of sense amplifier 306-0, compute component 331-0, and/or complementary digit lines 305-1 and 305-2 of column 0 (322-0) to move data values on digit line 0 and digit line 0* to shared I/O line 355. For example, the moved data values may be data values from a particular row 319 stored (cached) in sense amplifier 306-0 and/or compute component 331-0. Data values from each of columns 0 through 7 can similarly be selected by controller 140 activating the appropriate selection transistors.

Moreover, enabling (e.g., activating) the selection transistors (e.g., selection transistors 359-1 and 359-2) can enable a particular sense amplifier and/or compute component (e.g., 306-0 and/or 331-0, respectively) to be coupled with a shared I/O line 355 such that data values stored by an amplifier and/or compute component can be moved to (e.g., placed on and/or transferred to) the shared I/O line 355. In some embodiments, one column at a time is selected (e.g., column 322-0) to be coupled to a particular shared I/O line 355 to move (e.g., copy, transfer, and/or transport) the stored data values. In the example configuration of FIG. 3, the shared I/O line 355 is illustrated as a shared, differential I/O line pair (e.g., shared I/O line and shared I/O line*). Hence, selection of column 0 (322-0) could yield two data values (e.g., two bits with values of 0 and/or 1) from a row (e.g., row 319) and/or as stored in the sense amplifier and/or compute component associated with complementary digit lines 305-1 and 305-2. These data values could be input in parallel to each shared, differential I/O pair (e.g., shared I/O and shared I/O*) of the shared differential I/O line 355.

FIGS. 4A-4C are other schematic diagrams illustrating circuitry for data movement in a memory device in accordance with a number of embodiments of the present disclosure. As illustrated in FIGS. 1C and 1D and shown in more detail in FIGS. 4A and 4B, a bank section of a DRAM memory device can include a plurality of subarrays, which are indicated in FIGS. 4A and 4B at 425-0 as subarray 0 and at 425-N-1 as subarray N-1.

FIGS. 4A and 4B, which are to be considered as being horizontally connected, illustrate that each subarray (e.g., subarray 425-0 partly shown in FIG. 4A and partly shown in FIG. 4B) can have a number of associated sense amplifiers 406-0, 406-1, . . . , 406-X-1 and compute components 431-0, 431-1, . . . , 431-X-1. For example, each subarray, 425-0, . . . , 425-N-1, can have one or more associated sensing component stripes (e.g., 424-0, . . . , 424-N-1). According to embodiments described herein, each subarray, 425-0, . . . , 425-N-1, can be split into portions 462-1 (shown in FIG. 4A), 462-2, . . . , 462-M (shown in FIG. 4B). The portions 462-1, . . . , 462-M may each respectively include a particular number (e.g., 2, 4, 8, 16, etc.) of the sense amplifiers and/or compute components (e.g., sensing circuitry 150), along with the corresponding columns (e.g., 422-0, 422-1, . . . , 422-7) among columns 422-0, . . . , 422-X-1 that can be selectably coupled to a given shared I/O line (e.g., 455-M). Corresponding pairs of the sense amplifiers and compute components can contribute to formation of the sensing circuitry indicated at 450-0, 450-1, . . . , 450-X-1 in FIGS. 4A and 4B.

FIGS. 4A and 4B also illustrate that the bank section can include at least one latch stripe 472, which is schematically illustrated as being peripherally located in the bank section relative to the locations of subarrays 425-0, 425-1, . . . , 425-N-1. The latch stripe portions 472-1 and 472-M in FIGS. 4A and 4B may also be considered as being horizontally connected, which may extend, in some embodiments, parallel to, but not a part of, a width (e.g., an orientation and/or distance of a first memory cell to a last memory cell in a row) of a last subarray 425-N-1 in the bank section. However, embodiments are not so limited. For example, a latch stripe may be positioned and extend parallel to, but not a part of, the first subarray 425-0 in the bank section.

The latch stripe portions 472-1 and 472-M illustrated in FIGS. 4A and 4B show that each latch stripe can include a number of latches 465, which, in some embodiments, can be the same as and/or correspond to a number of sense amplifiers 465-0, 465-1, . . . , 465-X-1 of the embodiment of the latch stripe portions 472-1 and 472-M shown in FIGS. 4A and 4B. The latch stripe 473 illustrated in FIG. 4C also shows that each latch stripe can include a number of latches 470. For clarity, positions of the latches 470-X-8, 470-X-7, . . . , 470-X-1 illustrated in latch stripe portion 473-M in FIG. 4C correspond to the positions of the latches (e.g., sense amplifiers) 465-X-8, 465-X-7, . . . , 465-X-1 illustrated in latch stripe portion 472-M in FIG. 4B. Latch stripe 473 may also be considered as being horizontally connected, as shown in FIGS. 4A and 4B, and may extend, in some embodiments, parallel to a width (e.g., an orientation and/or distance of a first memory cell to a last memory cell in a row), but not be a part of, the last subarray 425-N-1 in the bank section, which includes the sensing circuitry 450 of sensing component stripe 424-N-1. Each of the latches 470-X-8, 470-X-7, . . . , 470-X-1 illustrated in latch stripe portion 472-M in FIG. 4C can include a respective sense amplifier 465-X-8, 465-X-7, . . . , 465-X-1 coupled to a respective compute component 466-X-8, 466-X-7, . . . , 466-X-1.

In various embodiments, one or more portions of latch stripes 472 and 473 may be at various positions relative to the subarrays in the bank section. For example, in some embodiments, a latch stripe may be positioned between subarrays. Hence, a plurality of latch stripes may have at least one latch stripe positioned between groups of subarrays (e.g., the groups being one or more subarrays) to form a latch stripe allocated to storage of data values for a particular group of subarrays (e.g., one or both groups).

A latch stripe can, in some embodiments, extend along the relative width of at least one subarray in the bank section. A single latch stripe and/or a plurality of latch stripes may each include a same number (e.g., 16,384) of sense amplifiers and/or compute components per latch stripe that corresponds to the number (e.g., 16,384) of memory cells in each row of the subarray to enable storage in each latch stripe of each data value stored in a row of the subarray. For example, a plurality of latch stripes may store data values from a respective plurality of rows of one or more subarrays.

In some embodiments, a latch stripe can include a number of latches that correspond to more than the number of memory cells in each row of a subarray. For example, the latches in the latch stripe can be configured as more than one row of latches, where each row of latches includes a number of latches more than, substantially equal to, or less than the number of memory cells in each row of the subarray.

Some embodiments can have more than one latch stripe where a width (e.g., a distance from a first to last sense amplifier and/or compute component) of each latch stripe can correspond to widths of relative sub-portions of at least one subarray. For example, when there are 16,384 memory cells in each row of a subarray, there may be various numbers of sense amplifiers and/or compute components per latch stripe associated with the subarrays that correspond to a sub-portion of the 16,384 memory cells (e.g., 16,384 memory cells divided by eight latch stripes yields 2048 sense amplifiers and/or compute components per latch stripe). A plurality of latch stripes configured as such may, in some embodiments, be positioned in staggered and/or stacked arrangements, among other possibilities, to relieve size and/or area constraints on pitch with other components in the bank section, among other reasons.

In some embodiments, as shown in FIGS. 3, 4A, and 4B, the particular number of the sense amplifiers and compute components, along with the corresponding columns, per subarray that can be selectably coupled to a shared I/O line 455 (which may be a pair of shared differential lines) can be eight. As such, the number of portions 462-1, 462-2, . . . , 462-M of the subarray (e.g., a number of subsets of the sense amplifiers and/or compute components that may be selectably coupled per shared I/O line) can be the same as the number of shared I/O lines 455-1, 455, 2, . . . , 455-M configured to couple to the subarray. The subarrays can be arranged according to various DRAM architectures for coupling shared I/O lines 455-1, 455, 2, . . . , 455-M between subarrays 425-0, 425-1, . . . , 425-N-1.

For example, portion 462-1 of subarray 0 (425-0) in FIG. 4A can correspond to the portion of the subarray illustrated in FIG. 3. As such, sense amplifier 0 (406-0) and/or compute component 0 (431-0) can be coupled to column 422-0. As described herein, a column can be configured to include a pair of complementary digit lines referred to as digit line 0 and digit line 0*. However, alternative embodiments can include a single digit line 405-0 (sense line) for a single column of memory cells. Embodiments are not so limited.

As illustrated in FIGS. 1C and 1D and shown in more detail in FIGS. 4A and 4B, a sensing component stripe can, in various embodiments, extend from one end of a subarray to an opposite end of the subarray. For example, as shown for subarray 0 (425-0), sensing component stripe 0 (424-0), which is shown schematically above and below the DRAM columns in a folded sense line architecture, can include and extend from sense amplifier 0 (406-0) and compute component 0 (431-0) in portion 462-1 to sense amplifier X-1 (406-X-1) and compute component X-1 (431-X-1) in portion 462-M of subarray 425-0.

As described in connection with FIG. 3, the configuration illustrated in FIGS. 4A and 4B for the sense amplifiers 406-0, 406-1, . . . , 406-X-1 in combination with the compute components 431-0, 431-1, . . . , 431-X-1 and shared I/O line 455-1 through shared I/O line 455-M is not limited to half the combination of the sense amplifiers with the compute components of the sensing circuitry (e.g., 450) being formed above the columns of memory cells and half being formed below the columns of memory cells 422-0, 422-1, . . . , 422-X-1 in a folded DRAM architecture. For example, in various embodiments, a sensing component stripe 424 for a particular subarray 425 can be formed with any number of the sense amplifiers and compute components of the sensing amplifier stripe being formed above and/or below the columns of memory cells. Accordingly, in some embodiments as illustrated in FIGS. 1C and 1D, all of the sense amplifiers and compute components of the sensing circuitry and corresponding sensing amplifier stripes can be formed above or below the columns of memory cells.

As described in connection with FIG. 3, each subarray can have column select circuitry (e.g., 358) that is configured to implement data movement operations with respect to particular columns 422 of a subarray, such as subarray 425-0, and the complementary digit lines thereof, coupling stored data values from the sense amplifiers 406 and/or compute components 431 to given shared I/O lines 455-1, . . . , 455-M (e.g., complementary shared I/O lines 355 in FIG. 3). For example, the controller 140 can direct that data values of memory cells in a particular row (e.g., row 319) of subarray 425-0 be sensed and moved (e.g., copied, transferred, and/or transported) to a same or different numbered row of subarrays 425-1, 425-2, . . . , 425-N-1 in a same or different numbered column. For example, in some embodiments, the data values can be moved from a portion of a first subarray to a different portion of a second subarray (e.g., not necessarily from portion 462-1 of subarray 0 to portion 462-1 of subarray N-1). For example, in some embodiments data values may be moved from a column in portion 462-1 to a column in portion 462-M using shifting techniques.

The column select circuitry (e.g., 358 in FIG. 3) can direct movement (e.g., sequential movement) of each of the eight columns (e.g., digit/digit*) in the portion of the subarray (e.g., portion 462-1 of subarray 425-0) for a particular row such that the sense amplifiers and compute components of the sensing amplifier stripe (e.g., 424-0) for that portion can store (cache) and move all data values to the shared I/O line in a particular order (e.g., in an order in which the columns were sensed). With complementary digit lines, digit/digit*, and complementary shared I/O lines 355, for each of eight columns, there can be 16 data values (e.g., bits) sequenced to the shared I/O line from one portion of the subarray such that one data value (e.g., bit) is input to each of the complementary shared I/O lines at a time from each of the sense amplifiers and compute components.

As such, with 2048 portions of subarrays each having eight columns (e.g., subarray portion 462-1 of each of subarrays 425-0, 425-1, . . . , 425-N-1), and each configured to couple to a different shared I/O line (e.g., 455-1 through 455-M) 2048 data values (e.g., bits) could be moved to the plurality of shared I/O lines at substantially the same point in time (e.g., in parallel). Accordingly, the plurality of shared I/O lines might be, for example, at least a thousand bits wide (e.g., 2048 bits wide), such as to increase the speed, rate, and/or efficiency of data movement in a DRAM implementation (e.g., relative to a 64 bit wide data path).

As illustrated in FIGS. 4A and 4B, in each subarray (e.g., subarray 425-0) one or more multiplexers 460-1 and 460-2 can be coupled to the sense amplifiers and/or compute components of each portion 462-1, 462-2, . . . , 462-M of the sensing amplifier stripe 424-0 for the subarray. The multiplexers 460 described in connection with FIGS. 4A and 4B can, in various embodiments, be inclusive of at least the functionality embodied by and contained in the column select circuitry 358 described in connection with FIG. 3. The multiplexers 460-1 and 460-2 can be configured to access, select, receive, coordinate, combine, and/or move (e.g., copy, transfer, and/or transport) the data values (e.g., bits) stored (cached) by the number of selected sense amplifiers and/or compute components in a portion (e.g., portion 462-1) of the subarray to the shared I/O line (e.g., shared I/O line 455-1). The multiplexers can be formed between the sense amplifiers and compute components and the shared I/O line. As such, a shared I/O line can, as described herein, be configured to couple a source location and a destination location for improved data movement between pairs of bank section subarrays and/or between bank section subarrays and a number of associated latch stripes (e.g., latch stripes 472 and 473 shown in FIGS. 4A-4C).

In various embodiments, each I/O line 455-1, 455-2, . . . , 455-M shared by the subarrays 425-0, 425-1, . . . , 425-N-1 can be selectably coupled to at least one latch stripe (e.g., latch stripes portions 472-1 and/or 472-M). As such, each I/O line 455-1, 455-2, . . . , 455-M may be selectably shared by the subarrays 425-0, 425-1, . . . , 425-N-1 and the latch stripes. The latch stripe portions 472-1 and 472-M illustrated in FIGS. 4A and 4B are shown by way of example as being selectably coupled to respective shared I/O lines 455-1 and 455-M at each end of the subarray portions 462-1 through 462-M, although the latch stripe 472 may be selectably coupled to each of the shared I/O lines in between shared I/O lines 455-1 and 455-M.

For example, the subarray portions 462-1 through 462-M in the respective subarrays 425-0 through 425-N-1 may include a number (e.g., eight) of a plurality sense amplifiers and/or compute components in each portion that may be selectably coupled to the shared I/O line, where that number may correspond to a number (e.g., eight) of a plurality of sense amplifiers 465-0, 465-1, . . . , 465-X-1 in each portion of the latch stripe 472-1, . . . , 472-M that stores the moved data values. For example, latch stripe portion 472-M illustrated in FIG. 4B shows eight sense amplifiers 465-X-8, 465-X-7, . . . , 465-X-1 as latches that can be selectably coupled to shared I/O line 455-M to move (e.g., either as a source or a destination location) eight data values to or from the sensing circuitry 450-X-8, 450-7, . . . , 450-X-1 in each of the sensing circuitry stripes 424-0 through 424-N-1 associated with each of the respective portions 462-M in subarrays 425-0, 425-1, . . . , 425-N-1.

A number of multiplexers 461-1 and 461-2 can be selectably coupled via input/output lines to the shared I/O line (e.g., 455-M) to facilitate movement (e.g., copying, transferring, and/or transporting as directed by data movement component 171 of controller 140) of a data value stored in a row of a subarray, via a respective sensing component stripe, to a selected latch (e.g., selected from sense amplifiers 465-X-8, 465-X-7, . . . , 465-X-1) in the latch stripe 472-M. The multiplexers 461-1 and 461-2 can similarly operate to move a stored data value from a selected latch in the latch stripe to a selected memory cell in at least one selected row of at least one selected subarray via a respective sensing component stripe.

A number of multiplexers 463-1 and 463-2 can be selectably coupled to a selected latch (e.g., selected from sense amplifiers 465-X-8, 465-X-7, . . . , 465-X-1) in the latch stripe portion 472-M to facilitate movement of a data value stored in the selected latch to a data bus 456 for that bank section (e.g., a portion of a combined data bus for a plurality of bank sections, banks, and/or memory devices). The movement can, in various embodiments, include copying, transferring, and/or transporting data as directed by the controller 140 and/or the host 110. The multiplexers 463-1 and 463-2 can similarly operate to move a data value from the host 110, via the combined data bus 456, to a selected latch in at least one latch stripe in at least one bank section, bank, and/or memory device.

The multiplexers 461-1, 461-2, 463-1, and 463-2 illustrated in latch stripe portion 473-M in FIG. 4C can operate as just described with respect to latches 470-X-8, 470-X-7, . . . , 470-X-1. Each of these latches, however, can include a compute component 466-X-8, 466-X-7, . . . , 466-X-1 coupled with a respective sense amplifier 465-X-8, 465-X-7, . . . , 465-X-1. The addition of a compute component to each latch can enable each latch to perform an operation, as described herein, on a data value stored in the sense amplifier of each latch. Such operations may be performed on data values stored in latches (e.g., in latches of a latch stripe) as directed by the controller 140 and/or the host 110 in order to be saved in the latch and/or prior to movement (e.g., copying, transferring, and/or transporting) of the data value from the latch (e.g., to a number of controllers, subarrays, bank sections, banks, and/or memory devices and/or to the host).

Although the sense amplifiers 465-X-8, 465-X-7, . . . , 465-X-1 are illustrated as being selectably coupled to shared I/O line 455-M via multiplexers 461-1 and 461-2 and the compute components 466-X-8, 466-X-7, . . . , 466-X-1 are illustrated as being selectably coupled to the data bus 456 for that bank section via multiplexers 463-1 and 463-2, embodiments are not so limited. For example, the sense amplifiers may be selectably coupled to the data bus and the compute components may be selectably coupled to the shared I/O line. Alternatively, only the sense amplifiers or only the compute components may be selectably coupled to both multiplexers 461-1 and 461-2 and multiplexers 463-1 and 463-2 (e.g., as shown for sense amplifiers 465-0, 465-1, . . . , 465-X-1 in FIGS. 4A and 4B). Moreover, in some embodiments, the sense amplifiers and the compute components may be selectably coupled in combination to both multiplexers 461-1 and 461-2 and multiplexers 463-1 and 463-2 (e.g., such that they jointly couple to both types of multiplexers rather than the sense amplifiers coupling to one type of multiplexer and the compute components coupling to the other type of multiplexer).

A data value moved from the host to the latch stripe may, for example, be part of a sequence of data values that contains at least one data value that differs (e.g., is changed from 0 to 1 or vice versa) from a data value in a sequence of data values already stored in the latch stripe and/or in a subarray of a bank section. As such, a sequence of instructions to perform an operation can be stored in the latch stripes to be output as a revised sequence of instructions, via multiplexers 461-1, 461-2, for storage in controllers, subarrays, bank sections, banks, and/or memory devices. The exchange 467 (e.g., input and/or output) of data with the host 110 can, for example, be via a number of DRAM DQs in the host.

As described in connection with the multiplexers 460-1 and 460-2 associated with subarrays 425-0, 425-1, . . . , 425-N-1 in FIGS. 4A and 4B, the multiplexers 461-1, 461-2, 463-1, and 463-2 illustrated in latch stripe portions 472-1 and 472-M in FIGS. 4A and 4B and 473-M in FIG. 4C can, in various embodiments, be inclusive of at least the functionality embodied by and contained in the column select circuitry 358 described in connection with FIG. 3. In addition, as described in connection with FIGS. 3, 4A, and 4B, the configuration illustrated in FIGS. 4A-4C for the compute components 466 and/or the sense amplifiers 465, and shared I/O line 455-1 through shared I/O line 455-M, is not limited to half the compute components 466 and/or the sense amplifiers 465 of the latches 465 and 470, respectively, being formed above the data bus 456 and half being formed below the data bus 456 in a folded DRAM architecture. For example, in various embodiments, a latch stripe 472 and 473 associated with a number of subarrays 425 can be formed with any number of the compute components and/or sense amplifiers of the latch stripe being formed above and/or below the data bus. Accordingly, in some embodiments, all of the compute components and/or sense amplifiers of the latch stripe, and corresponding multiplexers, can be formed above or below the data bus 456.

As described herein, a controller (e.g., 140) can be coupled to a bank (e.g., 121) of a memory device (e.g., 120) to direct a command (e.g., from the host 110) to move (e.g., copy, transfer, and/or transport) data. For example, the controller can be configured to move data values in the bank from a source location (e.g., a selected subarray 425-0 via an associated sensing component stripe 424-0) to a destination location (e.g., latch stripe portion 472-1). A bank can, in various embodiments, include a plurality of subarrays of memory cells in a bank section (e.g., subarrays 425-0 through 425-N-1). The bank can, in various embodiments, further include sensing circuitry (e.g., 150) on pitch with sense lines of the plurality of subarrays and coupled to the plurality of subarrays via the sense line (e.g., 205-1 and 205-2 in FIG. 2, 305-1 and 305-2 and at corresponding reference numbers in FIGS. 3, 4A and 4B). The sensing circuitry can include a sense amplifier and a compute component (e.g., 206 and 231, respectively, in FIG. 2 and at corresponding reference numbers in FIGS. 3, 4A and 4B) coupled to each of the sense lines and configured to implement the command to move (e.g., copy, transfer, and/or transport) the data.

The plurality of subarrays of memory cells, along with associated latch components, can, in some embodiments, be subarrays of DRAM cells in a same bank of DRAM cells (e.g., as described in connection with FIG. 1C). In some embodiments, the plurality of subarrays of memory cells, along with associated latch components, can be subarrays of DRAM cells in different banks of DRAM cells (e.g., as described in connection with FIG. 1B).

The bank can, in various embodiments, include a number of latches (e.g., 465 and 470) associated with the plurality of subarrays. Each of the number of latches can be configured to store (cache) a data value moved from the sensing circuitry. The bank can, in various embodiments, further include an I/O line (e.g., 355, 455-1, and 455-M) shared by the sensing circuitry and the number of latches, where the shared I/O line can enable movement of the data value stored by the sensing circuitry of a selected subarray to a selected latch.

The shared I/O line can be configured to selectably couple to a plurality of latch stripes, where each of the plurality of latch stripes is configured to include a subset of a plurality of latches. The controller can be further configured to selectably enable parallel movement of a plurality of data values stored in a number of selected rows of the selected subarray to the subsets of the plurality of latches (e.g., subsets of the plurality of data values stored in corresponding subsets of the plurality of latches, where each of the respective plurality of latches is in a different latch stripe).

The shared I/O line can be further configured to selectably couple to a number of a plurality of latch stripes, where each latch stripe of the plurality of latch stripes is configured to include a number of a plurality of latches to selectably enable movement of a respective number of a plurality of data values stored in the plurality of subarrays to the number of the plurality of latches. The number of the plurality of latch stripes can correspond to a number of a plurality of rows in the plurality of subarrays that store the number of the plurality of data values. For example, the data values stored in each row of the plurality of subarrays that is moved to the latches of the latch stripes can be moved to a number of latches that corresponds to the number of rows that store the data values (e.g., the data values that are stored in a first row are moved to latches in a first latch stripe, the data values that are stored in a second row are moved to latches in a second latch stripe, etc.). The number of the plurality of latches may also correspond to a number of a plurality of columns of memory cells in a subarray (or a portion thereof, as described herein) and/or in a bank (or a section thereof, as described herein).

The memory device can include a sensing component stripe (e.g., 124 in FIG. 1C and 424 in FIGS. 4A and 4B) configured to include a number of a plurality of sense amplifiers and compute components (e.g., 406-0, 406-1, . . . , 406-7 and 431-0, 431-1, . . . , 431-7, respectively, as shown in FIGS. 4A and 4B) that can correspond to a number of the plurality of columns (e.g., 122 in FIG. 1C and 305-1 and 305-2 in FIG. 3) of the memory cells. The number of sense amplifiers and/or compute components can be selectably coupled to a plurality of shared I/O lines (e.g., via column select circuitry 358-1 and 358-2). The column select circuitry can be configured to selectably sense data in a particular column of memory cells of a subarray by being selectably coupled to a plurality of (e.g., four, eight, and sixteen, among other possibilities) sense amplifiers and/or compute components.

The sense amplifiers and/or compute components in each of the plurality of sensing component stripes can be configured to selectably move a stored data value, via a selectably coupled shared I/O line, to a respective latch in the latch stripe. Each sensing component stripe of the plurality of sensing component stripes can include a respective subset of the plurality of sense amplifiers and compute components (e.g., the portions 462-1 through 462-M shown in FIGS. 4A and 4B that each include eight sense amplifiers and compute components). A multiplexer (e.g., 460-1 and 460-2 in FIGS. 4A and 4B) and/or column select circuitry (e.g., 358 in FIG. 3) can be configured to select a sense amplifier and/or compute component among a respective subset to selectably couple to a shared I/O line to selectably move a stored data value via the coupled shared I/O line. As described herein, a subarray can include a column of memory cells having a pair of complementary sense lines (e.g., 305-1 and 305-2 in FIG. 3) and the sensing circuitry can include a sense amplifier and/or a compute component coupled to each of the pair of complementary sense lines.

Hence, a sensing component stripe including the sense amplifiers and compute components can be configured to selectably move an amount of data sensed from a selected row of a selected subarray in parallel to a plurality of shared I/O lines. The amount of data can correspond to at least a thousand bit width of the plurality of shared I/O lines. In some embodiments, a number of the plurality of shared I/O lines can correspond to a number of bits wide shared I/O line. For example, 16,384 columns divided by eight sense amplifiers and compute components per subset yields 2048 shared I/O lines, which due to the parallel movement of the data values therein can be referred to as a 2048 bits wide shared I/O line.

The plurality of shared I/O lines can be configured to selectably couple to the sensing circuitry of a plurality of subarrays to selectably enable parallel movement of a plurality of data values stored by the sensing circuitry from memory cells in a selected row of the selected subarray to a plurality of latches. A latch can, in various embodiments, include a sense amplifier (e.g., sense amplifier 465 described in connection with FIGS. 4A and 4B) to store the data value or a latch can include a sense amplifier to store the data value and a compute component (e.g., compute component 466 described in connection with FIG. 4C) to enable an operation to be performed on the data value stored in the sense amplifier.

The apparatus can include access line select circuitry (not shown) coupled to an access line of each respective row (e.g., page) of each respective subarray. The access line select circuitry can be configured to enable sensing data values in a selected row of memory cells of a subarray (e.g., by activating the selected row) to be selectably coupled to a respective sense amplifier and/or compute component. As such, the controller 140 can be configured, in response to a command (e.g., from the host 110) to selectably sense data in the selected row of memory cells of a subarray and to move a sensed data value stored in the selected row via the shared I/O line to the latch.

The plurality of shared I/O lines described herein can be configured to selectably couple (e.g., via multiplexers 461-1 and 461-2 described in connection with FIGS. 4A-4C) to a latch stripe including a number of a plurality of latches to selectably enable parallel movement of a corresponding number of a plurality of data values stored in a selected row of the selected subarray to the number of the plurality of latches.

The memory device can include a plurality of sensing component stripes (e.g., 424-0, . . . , 424-N-1 in FIGS. 4A and 4B), where each sensing component stripe can be coupled to a respective subarray of the plurality of subarrays (e.g., 425-0, . . . , 425-N-1 in FIGS. 4A and 4B), and a latch stripe (e.g., 472 and 473 in FIGS. 4A-4C) configured to include a plurality of latches (e.g., 465 and 470 in FIGS. 4A-4C) to enable storage of a plurality of data values. The memory device can include an I/O line selectably shared by sensing circuitry (e.g., 150 in FIG. 1A) in the plurality of sensing component stripes and the plurality of latches (e.g., 465 and 466 in FIGS. 4A-4C). The memory device can further include a portion of a data bus (e.g., 456 in FIGS. 4A-4C) configured to selectably couple to the plurality of latches of the latch stripe to output stored data values.

The shared I/O line can be configured to selectably couple to the sensing circuitry in the plurality of sensing component stripes to enable the movement of the plurality of data values to the plurality of latches. The plurality of latches in the latch stripe can be configured to selectably move a plurality of stored data values via a multiplexer (e.g., via multiplexers 463-1 and 463-2 in FIGS. 4A-4C) to a selectably coupled portion of the data bus. As such, the plurality of latches can selectably output the stored data values via the portion of the data bus to a controller (e.g., 140 in FIG. 1A) for a bank of a plurality of subarrays and/or to a host 110. For example, the stored data values can be output to the controller in the same bank where the data values are stored and/or to a controller in a different bank of the plurality of banks (e.g., 121-0, . . . , 121-N as shown in FIG. 1B) in a plurality of memory devices (e.g., 120-1, . . . , 120-N as shown in FIG. 1B).

Each bank of the plurality of banks can be configured to selectably couple to a respective portion of the data bus to enable output of a plurality of data values from a latch stripe in each of the plurality of banks. The respective portions of the data bus can be configured as a combined data bus to selectably enable movement of the plurality of data values from the plurality of banks to the host.

A latch in the latch stripe can be configured to selectably move a stored data value, via a selectably coupled shared I/O line, to a corresponding sense amplifier and/or compute component in the plurality of sensing component stripes. For example, the plurality of latches in the latch stripe can be selectably coupled to a plurality of shared I/O lines to move in parallel a plurality of data values stored in the latches. The data values stored in the latches may, for example, have been moved to the latches as data stored in a row of a subarray in the same bank as the latches, as data stored in another bank, and/or as data (e.g., instructions) stored in the host.

The corresponding sense amplifier and/or compute component in one or more of the plurality of sensing component stripes can be configured to receive (e.g., store) the moved data value. The corresponding sense amplifier and/or compute component can be further configured to enable a data write operation (e.g., as directed by the controller and/or the host) on the moved data value to a selected row and/or selected column (e.g., a selected memory cell) of a selected subarray (e.g., one or more selected subarrays) in the bank. In some embodiments, the data value moved from the latch to the corresponding sense amplifier and/or compute component can be a data value upon which an operation was performed by the latch (e.g., using the compute component of the latch)

The apparatus can include a bank arbiter (e.g., as shown at 145 and described in connection with FIGS. 1A and 1B). The bank arbiter 145 can be configured to receive a set of instructions from the host 110 to perform a data movement operation and the bank arbiter can pass command instructions to execute the set of instructions to a controller in at least one of a plurality of banks. The bank arbiter 145 can aggregate status of the execution of the set of instructions to report back to a channel controller 143 of the host, where the status can include a status of the output of the stored data values from at least one latch stripe in the plurality of banks to a combined data bus from at least one of the plurality of banks.

The bank section can, in various embodiments, further include a shared I/O line (e.g., 355, 455-1, and 455-M) to couple the source location and the destination location to move (e.g., copy, transfer, and/or transport) the data. In addition, the controller can be configured to direct the plurality of subarrays and the sensing circuitry to perform a data write operation on the moved data to the destination location in the bank section (e.g., a selected memory cell in a particular row and/or column of a different selected subarray).

As described herein, the apparatus can include a sensing component stripe (e.g., 124 and 424) configured to include a number of a plurality of sense amplifiers and compute components that corresponds to a number of the plurality of columns of the memory cells (e.g., where each column of memory cells is coupled to a sense amplifier and a compute component). The number of a plurality of sensing component stripes in the bank section (e.g., 424-0 through 424-N-1) can correspond to a number of a plurality of subarrays in the bank section (e.g., 425-0 through 425-N-1).

The number of sense amplifiers and/or compute components can be configured to be selectably (e.g., sequentially) coupled to the shared I/O line (e.g., as shown by column select circuitry at 358-1, 358-2, 359-1, and 359-2 in FIG. 3). The column select circuitry can be configured to selectably sense data in a particular column of memory cells of a subarray by being selectably coupled to, for example, eight sense amplifiers and/or compute components in the source location (e.g., as shown in subarray 325 in FIG. 3 and subarray portions 462-1 through 462-M in FIGS. 4A and 4B). As such, the eight sense amplifiers and/or compute components in the source location can sequentially couple to the shared I/O line. According to the embodiments described herein, a number of shared I/O lines formed in the array can be configured by division of a number of columns in the array (e.g., bank and/or bank section) by the eight sense amplifiers and compute components coupled to each of the shared I/O lines. For example, when there are 16,384 columns in the array, or in each subarray thereof, and one sense amplifier and compute component per column, 16,384 columns divided by eight yields 2048 shared I/O lines.

The apparatus can, in various embodiments, include a number of multiplexers (e.g., as shown at 460-1 and 460-2 in portions 462-1 through 462-M of various subarrays in FIGS. 4A and 4B). In various embodiments, the apparatus can include a plurality of sense amplifiers and compute components and a multiplexer to select a sense amplifier and/or a compute component to couple to the shared I/O line. The multiplexers can be formed between the sense amplifiers and compute components and the shared I/O line to access, select, receive, coordinate, combine, and/or move (e.g., copy, transfer, and/or transport) selected data to the coupled shared I/O line.

As described herein, an array of memory cells can include a column of memory cells having a pair of complementary sense (digit) lines (e.g., 305-1 and 305-2 in FIG. 3). The sensing circuitry can, in some embodiments, include a sense amplifier (e.g., 306-0) selectably coupled to each of the pair of complementary sense (digit) lines and a compute component (e.g., 331-0) coupled to the sense amplifier via pass gates (e.g., 307-1 and 307-2).

Accordingly, embodiments described herein provide a method for operating a memory device to implement data movement performed by execution of non-transitory instructions by a processing resource. The method can include selectably coupling a controller (e.g., 140) in each of a number of banks (e.g., 121-0, . . . , 121-N as shown in FIG. 1B), where each controller can be selectably coupled to sensing circuitry in a number of sensing component stripes and a number of latch stripes in each of the number of banks. The controller can, in some embodiments, be configured to execute the non-transitory instructions in at least one of the number of banks via the processing resource.

As described herein, the method can include selectably coupling a shared I/O line to a sensing component stripe and a selected latch to enable movement of a data value stored in the sensing component stripe to the selected latch. A plurality of shared I/O lines may be selectably coupled (via a first multiplexer) to selected sense amplifiers and/or compute components in a selected sensing component stripe that stores a plurality of data values sensed from a selected row of a selected subarray. A number of a plurality of data values stored in a selected row of a selected subarray may be moved in parallel to a corresponding number of a selected plurality of latches in a latch stripe. The method can further include selectably coupling (e.g., via a second multiplexer) the selected latch to a portion of a data bus to enable selectable output of the data value stored in the latch.

The method can further include moving a number of a plurality of data values (e.g., all the data values) stored in a selected row of a selected subarray, via the selectably coupled shared I/O line, in parallel to a corresponding number of a plurality of latches. The number of the plurality of latches can, in various embodiments, be present in a plurality of latch stripes. For example, the selected row and/or a coupled sensing component stripe may be configured to store a total of 16,384 data values, which may be moved to, via appropriate coupling of a plurality of shared I/O lines, eight latch stripes each including 2048 latches for combined storage of the total 16,384 data values, in some embodiments. This may be done, for example, to relieve size and/or area constraints associated with other components in the bank, among other reasons.

The method can further include reducing latency of movement of the plurality of data values to the host by storing the plurality of data values in the plurality of latches of a selected latch stripe associated with a portion of a data bus. The selected latch stripe being positioned (e.g., formed) in a bank closer to the associated portion of the data bus relative to positions of the memory cells of the plurality of subarrays and/or the associated plurality of sensing component stripes may contribute to reducing the latency of data movement. For example, as shown in FIGS. 4B and 4C, the data values can be stored in latches 465 of latch stripe 472-M and and/or in latches 470 of latch stripe 473-M, respectively, that can be selectably coupled (e.g., via multiplexers 463-1 and 463-2) to an adjacent data bus 456 that is configured 467 to output data values to and/or input data values from the host 110. Latch stripe 472-1 through 472-M is shown in FIGS. 4A and 4B to be positioned in the bank closer to the adjacent data bus 456 than the positions of the memory cells of the plurality of subarrays 425-0 through 425-N-1 and/or the positions of the associated plurality of sensing component stripes 424-0 through 424-N-1.

The method can further include moving, from the latch, a data value upon which an operation has been performed to a selected row (e.g., to a memory cell in the selected row) in the plurality of subarrays and overwriting a data value in the selected row (e.g., the data value stored in the memory cell in the selected row) that was originally moved to the latch. For example, an operation, as described herein, can be performed in a latch on a data value that was moved to the latch and the data value can be moved back to the same memory cell to overwrite the data value originally moved to the latch.

In various embodiments, the method can further include moving, from a plurality of latches in a latch stripe, a stored plurality of data values to a selected second row in the plurality of subarrays that differs from a selected first row from which the stored data values were originally moved. In some embodiments, the stored plurality of data values can be a plurality of data values upon which an operation has been performed. The method can further include, in various embodiments, moving, from a plurality of latches in the latch stripe, a stored plurality of data values to a plurality of selected rows in a plurality of subarrays in a bank of the plurality of subarrays. For example, the stored plurality of data values moved to the plurality of selected rows in the plurality of subarrays (e.g., one selected row in each of the selected plurality of subarrays) in a bank can be a plurality of data values upon which an operation has been performed (e.g., as directed by the controller and/or the host).

In various embodiments, the method can further include sensing a data value in a selected row (e.g., in a selected memory cell in the selected row) of a selected subarray, moving the sensed data value from the sensing component stripe to a latch, and moving the stored data value from the latch to a data bus. The sensed data value can be stored in a sensing component stripe coupled to the selected subarray and the moved data value can be stored in the latch, as described herein.

The method can further include selectably outputting to a host, via at least one portion of the data bus, at least one data value of a plurality of values stored in a plurality of latches. A subset of the plurality of latches can be in each of a number of latch stripes and at least one of the plurality of latch stripes can be in each of a plurality of banks of subarrays. The plurality of latches in the number of latch stripes in each of the plurality of banks can each be selectably coupled to a respective portion of the data bus. The respective portion of the data bus for each of the plurality of banks can be combined to form a combined data bus. Each respective portion of the combined data bus can be selectably coupled to the host. For example, the data values can, in some embodiments, be outputted via the combined data bus to a number of DQ components in the host to enable a read operation and/or a write operation on the data values from the plurality of banks.

The method can further include performing (e.g., in a sensing component stripe) an operation on at least one data value stored in the selected row (e.g., stored in a selected memory cell in the selected row) of the selected subarray in parallel with (e.g., at substantially the same point in time) outputting to a host, via the data bus, the data value stored in the latch. For example, the data value stored in the latch can be included in a sensed plurality of data values moved from the sensing component stripe of the selected subarray to a plurality of latches in a latch stripe of a selected bank.

The method can further include inputting from a host, via the combined data bus, a data value to a latch in a selected bank of subarrays (e.g., selected from a plurality of banks of subarrays as shown in FIG. 1B). The data value can be moved to a sensing component stripe by selectably coupling the latch and the sensing component stripe via an I/O line shared by the latch and the sensing component stripe. The data value can be written to a selected row of a selected subarray of a selected bank (e.g., written to at least one selected memory cell therein). The data value to be written can, in some embodiments, differ from a data value output via the combined data bus to the host by an operation being performed thereon by the host. The combined data bus can include a portion of the combined data bus for each of a plurality of banks. For example, the data values can, in some embodiments, be input from a number of DQ components in the host that may have performed an operation on data values outputted from the banks via the combined data bus such that at least one of the input data values may differ from the output data values.

As described herein, a destination sensing component stripe (e.g., 124 and 424) can be the same as a source sensing component stripe. For example, a plurality of sense amplifiers and/or compute components can be selected and configured (e.g., depending on the command from the controller) to selectably move (e.g., copy, transfer, and/or transport) sensed data to the coupled shared I/O line and selectably receive the data from one of a plurality of coupled shared I/O lines (e.g., to be moved to the destination location). Selection of sense amplifiers and/or compute components in the destination sensing component stripe can be performed using the column select circuitry (e.g., 358-1, 358-2, 359-1, and 359-2 in FIG. 3) and/or the multiplexers described herein (e.g., 460-1 and 460-2 in FIGS. 4A and 4B).

The controller can, according to some embodiments, be configured to write an amount of data (e.g., a number of data bits) selectably received by the plurality of selected sense amplifiers and/or compute components in the destination sensing component stripe to a selected row and/or columns of the destination location in the destination subarray. In some embodiments, the amount of data to write corresponds to the at least a thousand bit width of a plurality of shared I/O lines.

The destination sensing component stripe can, according to some embodiments, include a plurality of selected sense amplifiers and/or compute components configured to store received data values (e.g., bits) when an amount of received data values (e.g., the number of data bits) exceeds the at least a thousand bit width of the plurality of shared I/O lines. The controller can, according to some embodiments, be configured to write the stored data values (e.g., the number of data bits) to a selected row and/or columns in the destination location as a plurality of subsets. In some embodiments, the amount of data values of at least a first subset of the written data can correspond to the at least a thousand bit width of the plurality of shared I/O lines. According to some embodiments, the controller can be configured to write the stored data values (e.g., the number of data bits) to the selected row and/or columns in the destination location as a single set (e.g., not as subsets of data values).

As described herein, the controller can select (e.g., open via an appropriate select line) a first row of memory cells, which corresponds to the source location, for the first sensing component stripe to sense data stored therein, couple (e.g., open) the plurality of shared I/O lines to the first sensing component stripe, and couple (e.g., open) the latch stripe to the plurality of shared I/O lines (e.g., via the column select circuitry 358-1, 358-2, 359-1, and 359-2 and/or the multiplexers 460-1, 460-2, 461-1, and 461-2). As such, the data can be moved in parallel from the first sensing component stripe to the latch stripe via the plurality of shared I/O lines. The first sensing component stripe can store (e.g., cache) the sensed data and the latch stripe can store (e.g., cache) the moved data. The reverse can be done to move data values from the latch stripe to the sensing component stripe.

The controller can select (e.g., open) a second row of memory cells, which corresponds to the destination location, for the second sensing component stripe (e.g., via the column select circuitry 358-1, 358-2, 359-1, and 359-2 and/or the multiplexers 460-1 and 460-2). The controller can then direct writing the data moved to the second sensing component stripe to the destination location in the second row of memory cells.

In a DRAM implementation, a shared I/O line can be used as a data path (e.g., a data flow pipeline) to move (e.g., copy, transfer, and/or transport) data in the memory cell array between various locations (e.g., between subarrays and/or between subarrays and latch stripes) in the array. The shared I/O line can be shared between all sensing component stripes and latch stripes. In various embodiments, one sensing component stripe or latch tripe and/or one pair of a sensing component stripe and a latch stripe (e.g., coupling a source location and a destination location) can communicate with the shared I/O line at any given time. The shared I/O line can be used to accomplish moving (e.g., copying, transferring, and/or transporting) the data from one sensing component stripe to the latch stripe and vice versa.

A row can be selected (e.g., opened by the controller and/or subarray controller via an appropriate select line) for the first sensing component stripe and the data values of the memory cells in the row can be sensed. After sensing, the first sensing component stripe can be coupled to the shared I/O line, along with coupling the latch stripe to the same shared I/O line. The latches of the latch stripe can still be in a pre-charge state (e.g., ready to accept data). After the data from the first sensing component stripe has been moved (e.g., driven) into the latch stripe, the latch stripe can fire (e.g., latch) the data into respective sense amplifiers and/or compute components.

Embodiments of the present disclosure may increase a speed, rate, and/or efficiency of data movement in a PIM array by using an improved data path (e.g., a shared I/O line) of a DRAM implementation. As described herein, a source location and a destination location in a pair of bank locations in a memory device can be configured to couple via a plurality of shared I/O lines. A bank in the memory device can, as described herein, include an array of memory cells, sensing circuitry coupled to the array via a plurality of sense lines, the sensing circuitry including sense amplifiers and compute components configured to implement operations, and a controller coupled to the array and the sensing circuitry.

A command can be received from the controller to move (e.g., copy, transfer, and/or transport) data from the source location to the destination location (e.g., of a DRAM array of the memory cells). The data values can be moved from the source location to the destination location (e.g., of the DRAM array) using the sense amplifiers and/or compute components via the plurality of shared I/O lines.

In some embodiments, 2048 shared I/O lines can be configured as a 2048 bit wide shared I/O line. According to some embodiments, a number of cycles for moving (e.g., copying, transferring, and/or transporting) the data from a first row in the source location to a latch stripe in the destination location can be configured by dividing a number of columns in the array intersected by a row of memory cells in the array by the 2048 bit width of the plurality of shared I/O lines. For example, an array (e.g., a bank, a bank section, and/or a subarray thereof) can have 16,384 columns, which can correspond to 16,384 data values in a row, which when divided by the 2048 bit width of the plurality of shared I/O lines intersecting the row can yield eight cycles, each separate cycle being at substantially the same point in time (e.g., in parallel) for movement of all the data in the row. Alternatively or in addition, a bandwidth for moving (e.g., copying, transferring, and/or transporting) the data from a first row in the source location to a second row in the destination location can be configuring by dividing the number of columns in the array intersected by the row of memory cells in the array by the 2048 bit width of the plurality of shared I/O lines and multiplying the result by a clock rate of the controller. In some embodiments, determining a number of data values in a row of the array can be based upon the plurality of sense (digit) lines in the array.

While example embodiments including various combinations and configurations of sensing circuitry, sense amplifiers, compute components, sensing component stripes, shared I/O lines, column select circuitry, multiplexers, latch components, latch stripes, and/or latches, etc., have been illustrated and described herein, embodiments of the present disclosure are not limited to those combinations explicitly recited herein. Other combinations and configurations of the sensing circuitry, sense amplifiers, compute components, sensing component stripes, shared I/O lines, column select circuitry, multiplexers, latch components, latch stripes, and/or latches, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device, comprising:
a plurality of banks, wherein each bank of the plurality of banks is configured to selectably couple to a host via a portion of a data bus that is configured as a combined data bus for the plurality of banks;
a plurality of subarrays of memory cells in a first bank;
sensing circuitry coupled to the plurality of subarrays, the sensing circuitry including a sense amplifier and a compute component;
a latch selectably coupled to a column of the memory cells and configured to store a data value moved from the sensing circuitry;
a first controller in the first bank configured to direct movement of the data value from the sensing circuitry to the latch; and
a second controller in a second bank configured to direct movement of the data value to a selected subarray of the second bank; and
wherein the host is configured to direct movement of the data value from the latch in the first bank to the second bank in the plurality of banks via the combined data bus.

2. The apparatus of claim 1, wherein:
a latch component including the latch is formed on a periphery of a bank;
the sensing circuitry is included in a plurality of sensing component stripes; and
each sensing component stripe of the plurality of sensing component stripes is physically associated with a respective subarray of the plurality of subarrays in the bank.

3. The apparatus of claim 1, wherein the latch is further configured to selectably couple to the controller to enable access by the controller to the data value stored in the latch.

4. The apparatus of claim 1, wherein the latch is further configured to:
enable an operation to be performed on the data value stored in the latch; and
the data value on which the operation has been performed differs from the moved data value.

5. The apparatus of claim 1, wherein:
a latch is in a bank of the memory device and is configured to:
selectably couple to a data bus associated with the bank to output a stored data value from the latch to a host.

6. The apparatus of claim 1, wherein memory device is configured to:
perform an operation on the data value stored in a selected subarray in parallel with output to a host, via a data bus, of a data value stored in the latch; and
wherein the data value stored in the latch is a sensed data value moved from the sensing circuitry coupled to a selected subarray to the latch.

7. An apparatus, comprising:
a controller coupled to a memory device to direct a command for data movement, wherein the memory device comprises:
a plurality of subarrays of memory cells;
sensing circuitry on pitch with a sense line of the plurality of subarrays and coupled to the plurality of subarrays, the sensing circuitry including a first sense amplifier and a first compute component coupled to the sense line;
a latch component including a second sense amplifier configured to store a first data value moved from the sensing circuitry and including a second compute component configured to store a second data value moved from the sensing circuitry to enable a logical operation to be performed on the first and second data values; and
an I/O line shared by the sensing circuitry and the latch component and configured to selectably couple to the sensing circuitry to enable movement of the data value stored by the sensing circuitry of a selected subarray to the latch component.

8. The apparatus of claim 7, wherein:
a plurality of shared I/O lines is configured to:
selectably couple to the sensing circuitry of a plurality of subarrays to selectably enable parallel movement of a plurality of data values stored by the sensing circuitry from memory cells in a selected row of the selected subarray to a plurality of latch components.

9. The apparatus of claim 7, wherein the plurality of subarrays of memory cells are subarrays of dynamic random access memory (DRAM) cells in a same bank of DRAM cells.

10. The apparatus of claim 7, wherein the plurality of subarrays of memory cells are subarrays of dynamic random access memory (DRAM) cells in different banks of DRAM cells.

11. The apparatus of claim 7, wherein the apparatus further comprises:
a sensing component stripe configured to include a number of a plurality of the first sense amplifiers and compute components that corresponds to a number of a plurality of columns of the memory cells; and
wherein the number of the plurality of the first sense amplifiers and compute components is selectably coupled to a plurality of shared I/O lines.

12. The apparatus of claim 7, wherein the apparatus further comprises:
column select circuitry configured to:
selectably sense a data value in a selected column of memory cells of a subarray by being selectably coupled to a respective first sense amplifier and compute component; and
move the sensed data value by being selectably coupled to the shared I/O line.

13. The apparatus of claim 7, wherein the apparatus further comprises:
access line select circuitry configured to:
enable sensing data values in a selected row of memory cells of a subarray to be selectably coupled to a respective first sense amplifier and compute component.

14. The apparatus of claim 7, wherein:
the controller is configured, in response to a command:
to selectably sense data in a selected row of memory cells of a subarray; and
to move a sensed data value stored in the selected row via the shared I/O line to the latch component.

15. The apparatus of claim 7, wherein:
a plurality of shared I/O lines is further configured to:
selectably couple to a latch stripe including a number of a plurality of latch components to selectably enable parallel movement of a corresponding number of a plurality of data values stored in a selected row of the selected subarray to the number of the plurality of latch components.

16. The apparatus of claim 7, wherein:
the shared I/O line is further configured to:
selectably couple to a plurality of latch stripes, wherein each latch stripe of the plurality of latch stripes is configured to include a subset of a plurality of latch components; and
the controller is further configured to:
selectably enable parallel movement of a plurality of data values stored in the selected subarray to the subsets of the plurality of latch components.

17. The apparatus of claim 7, wherein:
the shared I/O line is further configured to:
selectably couple to a number of a plurality of latch stripes, wherein each latch stripe of the plurality of latch stripes is configured to include:
a number of a plurality of latch components s to selectably enable movement of a respective number of a plurality of data values stored in the plurality of subarrays to the number of the plurality of latch components; and
wherein the number of the plurality of latch stripes corresponds to a number of a plurality of rows in the plurality of subarrays that store the number of the plurality of data values.

18. A method for operating a memory device:
the memory device comprising:
a plurality of subarrays of memory cells;
a sensing component stripe associated with each subarray of the plurality of subarrays, the sensing component stripe including a first sense amplifier and a first compute component coupled to a corresponding sense line;
a latch component including a second sense amplifier configured to store a first data value moved from the sensing circuitry and including a second compute component configured to store a second data value moved from the sensing circuitry to enable a logical operation to be performed on the first and second data values;
an I/O line shared by the sensing component stripe and the latch component; and
the method comprising:
selectably coupling the shared I/O line to the sensing component stripe and a selected latch component to enable:
moving the first and second data values stored in the sensing component stripe to the selected latch component; and
moving, from the selected latch component, a data value upon which a logical operation has been performed on the first and second data values to a selected row in the plurality of subarrays.

19. The method of claim 18, wherein the method further comprises selectably coupling a plurality of shared I/O lines to selected sense amplifiers and compute components in a selected sensing component stripe that stores a plurality of data values sensed from a selected row of a selected subarray.

20. The method of claim 18, wherein the method further comprises moving a number of a plurality of data values stored in a selected row of a selected subarray in parallel to a corresponding number of a selected plurality of latch components in a latch stripe.

21. The method of claim 18, wherein the method further comprises selectably coupling the selected latch component to a portion of a data bus to enable selectable output of the data value stored in the latch component.

22. The method of claim 21, wherein the method further comprises selectably coupling via a multiplexer the selected latch component to the portion of the data bus.

23. The method of claim 18, wherein the method further comprises:
moving a number of a plurality of data values stored in a selected row of a selected subarray, via the selectably coupled shared I/O line, in parallel to a corresponding number of a plurality of latch components; and
wherein the number of the plurality of latch components is positioned in a plurality of latch stripes.

24. The method of claim 18, wherein the method further comprises:
moving a plurality of data values of a selected row of a selected subarray, via the selectably coupled shared I/O line, in parallel to a corresponding number of a plurality of latch components; and
reducing latency of movement of the plurality of data values to a host by storing the plurality of data values in the plurality of latch components of a selected latch stripe associated with a portion of a data bus; and
wherein the selected latch stripe is positioned in a bank closer to the associated portion of the data bus relative to positions of the memory cells of the plurality of subarrays and the associated plurality of sensing component stripes.

25. The method of claim 18, wherein the method further comprises
overwriting the data value in the selected row that was originally moved to the latch component.

26. The method of claim 18, wherein the method further comprises moving, from a plurality of latch components in a latch stripe, a stored plurality of data values to a selected second row in the plurality of subarrays that differs from a selected first row from which the stored data values were originally moved.

27. The method of claim 18, wherein the method further comprises moving, from a plurality of latch components in a latch stripe, a stored plurality of data values to a plurality of selected rows in a plurality of subarrays in a bank of the plurality of subarrays.

28. A method for operating a memory device, comprising:
sensing a data value in a selected row of a selected subarray of the memory device, wherein the sensed data value is stored in a sensing component stripe coupled to the selected sub array;
moving the sensed data value from the sensing component stripe to a latch, wherein the moved data value is stored in the latch;
moving the stored data value from the latch to a data bus; and
selectably outputting to a host, via at least one portion of the data bus, at least one data value of a plurality of values stored in a plurality of latches; and wherein:
a subset of the plurality of latches is in each of a number of latch stripes and at least one of the plurality of latch stripes is in each of a plurality of banks of subarrays;
the plurality of latches in the number of latch stripes in each bank of the plurality of banks is selectably coupled to a respective portion of the data bus;
the respective portion of the data bus for each bank of the plurality of banks is combined to form a combined data bus; and
each respective portion of the combined data bus is selectably coupled to the host.

29. The method of claim 28, wherein the method further comprises:
- performing an operation on at least one data value stored in the selected row of the selected subarray in parallel with outputting to the host, via the data bus, the data value stored in the latch; and
- wherein the data value stored in the latch is included in a sensed plurality of data values moved from the sensing component stripe of the selected subarray to the plurality of latches in a latch stripe of a selected bank.

30. The method of claim 28, wherein the method further comprises:
- inputting from the host, via the combined data bus, a data value to a latch in a selected bank of subarrays;
- moving the data value to a sensing component stripe in the selected bank by selectably coupling the latch and the sensing component stripe via an I/O line shared by the latch and the sensing component stripe;
- writing the data value to a selected row of a selected subarray in the selected bank; and wherein:
  - the data value to be written is a data value output via the combined data bus to the host and subsequent to an operation being performed thereon by the host.

31. The method of claim 28, wherein the method further comprises:
- selectably coupling a controller in each of a number of banks, wherein each controller is selectably coupled to a number of sensing component stripes and a number of latch stripes in each bank of the number of banks; and
- wherein the controller executes the non-transitory instructions in at least one of the number of banks via the processing resource.

32. A method for operating a memory device, comprising:
- inputting from a host, via a combined data bus, a data value to a latch in a selected bank of subarrays;
- moving the data value to a sensing component stripe in the selected bank by selectably coupling the latch and the sensing component stripe via an I/O line shared by the latch and the sensing component stripe;
- writing the data value to a selected row of a selected subarray of the selected bank;
- sensing the data value in the selected row of the selected subarray, wherein the sensed data value is stored in a sensing component stripe coupled to the selected subarray;
- moving the sensed data value from the sensing component stripe to the latch, wherein the moved data value is stored in the latch; and
- moving the stored data value from the latch to a data bus; and wherein:
- the data value to be written is a data value output via the combined data bus to the host and subsequent an operation being performed thereon by the host; and
- the combined data bus includes a portion of the combined data bus for each bank of a plurality of banks.

* * * * *